US010802098B2

(12) United States Patent
Basser et al.

(10) Patent No.: US 10,802,098 B2
(45) Date of Patent: Oct. 13, 2020

(54) MAGNETIC RESONANCE 2D RELAXOMETRY RECONSTRUCTION USING PARTIAL DATA

(71) Applicants: The United States of America, as represented by the Secretary, Department of Health and Human Services, Bethesda, MD (US); University of Maryland, College Park, College Park, MD (US)

(72) Inventors: Peter J. Basser, Washington, DC (US); Ruiliang Bai, Bethesda, MD (US); Alexander Cloninger, New Haven, CT (US); Wojciech Czaja, Silver Spring, MD (US)

(73) Assignees: The United States of America, as represented by the Secretary, Department of Health and Human Services, Bethesda, MD (US); University of Maryland, College Park, College Park, MD (US)

( * ) Notice: Subject to any disclaimer, the term of this patent is extended or adjusted under 35 U.S.C. 154(b) by 0 days.

(21) Appl. No.: 16/839,931

(22) Filed: Apr. 3, 2020

(65) Prior Publication Data

US 2020/0233051 A1 Jul. 23, 2020

Related U.S. Application Data

(63) Continuation of application No. 15/312,162, filed as application No. PCT/US2015/026533 on Apr. 17, 2015, now Pat. No. 10,613,176.

(Continued)

(51) Int. Cl.
*G01R 33/50* (2006.01)
*G01R 33/56* (2006.01)
*G01R 33/44* (2006.01)

(52) U.S. Cl.
CPC .......... *G01R 33/50* (2013.01); *G01R 33/448* (2013.01); *G01R 33/5608* (2013.01)

(58) Field of Classification Search
CPC ... G01R 33/50; G01R 33/5608; G01R 33/448
(Continued)

(56) References Cited

U.S. PATENT DOCUMENTS

| 2008/0024128 A1* | 1/2008 | Song | G01R 33/5617 324/307 |
|---|---|---|---|
| 2008/0197842 A1* | 8/2008 | Lustig | G01R 33/5635 324/307 |

(Continued)

OTHER PUBLICATIONS

Bai et al., "Efficient 2D MRI Relaxometry Using Compressed Sensing," *Journal of Magnetic Resonance* 255:88-99, 2015.
(Continued)

*Primary Examiner* — Christopher P McAndrew
(74) *Attorney, Agent, or Firm* — Klarquist Sparkman, LLP

(57) ABSTRACT

An approach is presented to recontruct image data for an object using a partial set of magnetic resonance (MR) measurements. A subset of data points in a data space representing an object are selected (e.g. through random sampling) for MR data acquisition. Partial MR data corresponding to the subset of data points is received and used for image reconstruction. The overall speed of image reconstruction can be reduced dramatically by relying on acquisition of data for the subset of data points rather than for all data points in the data space representing the object. Compressive sensing type arguments are used to fill in missing measurements, using a priori knowledge of the structure of (Continued)

the data. A compressed data matrix can be recovered from measurements that form a tight frame. It can be established that these measurements satisfy the restricted isometry property (RIP). The zeroth-order regularization minimization problem can then be solved, for example, using a 2D ILT approach.

21 Claims, 18 Drawing Sheets

Related U.S. Application Data

(60) Provisional application No. 62/000,316, filed on May 19, 2014.

(58) Field of Classification Search
USPC .......................................................... 324/309
See application file for complete search history.

(56) References Cited

U.S. PATENT DOCUMENTS

| | | | | |
|---|---|---|---|---|
| 2008/0252291 | A1* | 10/2008 | Hoogenraad | G01R 33/56341 324/309 |
| 2010/0072995 | A1* | 3/2010 | Nishiyama | G01R 33/4608 324/307 |
| 2010/0264924 | A1* | 10/2010 | Stemmer | G01R 33/56375 324/309 |
| 2010/0322497 | A1* | 12/2010 | Dempsey | G01R 33/5608 382/131 |
| 2011/0044524 | A1* | 2/2011 | Wang | G01R 33/54 382/131 |
| 2012/0155730 | A1* | 6/2012 | Metaxas | G01R 33/5608 382/131 |
| 2012/0235678 | A1* | 9/2012 | Seiberlich | G01R 33/543 324/307 |
| 2013/0099786 | A1* | 4/2013 | Huang | G01R 33/56 324/56 |
| 2013/0307536 | A1* | 11/2013 | Feng | G01R 33/482 324/309 |
| 2014/0055134 | A1* | 2/2014 | Fordham | G01R 33/50 324/309 |
| 2014/0132605 | A1* | 5/2014 | Tsukagoshi | G06T 19/20 345/424 |
| 2014/0219531 | A1* | 8/2014 | Epstein | G06T 7/20 382/131 |
| 2014/0296702 | A1* | 10/2014 | Griswold | A61B 5/0017 600/416 |
| 2016/0320466 | A1* | 11/2016 | Berker | G01R 33/50 |
| 2017/0003368 | A1* | 1/2017 | Rathi | G01R 33/56341 |

OTHER PUBLICATIONS

Cloninger et al., "Solving 2D Fredholm Integral from Incomplete Measurements Using Compressive Sensing," *Siam Journal on Imaging Sciences* 7:1775-1798, 2014.

Huang et al., "$T_2$ Mapping from Highly Undersampled Data by Reconstructions of Principal Component Coefficient Maps Using Compressed Sensing," *Journal of Magnetic Resonance* 67:1355-1366, 2012.

International Search Report and Written Opinion from International Application No. PCT/US2015/026533, dated Jul. 6, 2015, 13 pages.

Majumdar and Ward, "An Algorithm for Sparse MRI Reconstruction by Schatten p-norm Minimization," *Magnetic Resonance Imaging* 29:408-417, 2011.

Mitchell et al., "Numerical Estimation of Relaxation and Diffusion Distributions in Two Dimensions," *Progress in Nuclear Magnetic Resonance Spectroscopy* 62:34-50, 2012.

Mitchell et al., "Magnetic Resonance Imaging in Laboratory Petrophysical Core Analysis," *Physics Reports* 526:165-225, 2013.

Venkataramanan et al., "Solving Fredholm Integrals of the First Kind With Tensor Product Structure in 2 and 2.5 Dimensions," *IEEE Transactions on Signal Processing* 50:1017-1026, 2002.

Zhao et al., "Low Rank Matrix Recovery for Real-Time Cardiac MRI," IEEE International Symposium on Biomedical Imaging: From Nano to Macro, IEEE, Piscataway, NJ, USA, Apr. 14, 2010, pp. 996-999, 2010.

* cited by examiner

MAGNETIC RESONANCE 2D RELAXOMETRY RECONSTRUCTION USING PARTIAL DATA

PRIORITY CLAIM

This application is a continuation of U.S. patent application Ser. No. 15/312,162, filed Nov. 17, 2016, which is the U.S. National Stage of International Application No. PCT/US2015/026533, filed Apr. 17, 2015, which was published in English under PCT Article 21(2), which in turn claims the benefit of U.S. Provisional Application No. 62/000,316, filed on May 19, 2014. These applications are hereby incorporated by reference in their entireties.

GOVERNMENT SUPPORT

This invention was made jointly with the National Institutes of Health. The government has certain rights in the invention.

BACKGROUND

The power of magnetic resonance (MR) techniques, including nuclear magnetic resonance (NMR) and electron spin resonance (ESR) has been significantly increased in recent years by the inclusion of added dimensions in the Fourier domain, expanding the ability to determine molecule structure, dynamics, and kinetics. MR techniques have also been advanced by the development of multi-dimensional diffusion/relaxation pulse sequences through the use of robust and accurate two-dimensional (2D) inverse Laplace transform (ILT) algorithms and data analysis methods. However, the amount of 2D MR relaxation data and the time required to acquire this data makes 2D relaxometry infeasible and/or impractical. This limitation is particularly severe if one attempts to combine MR relaxometry methods with magnetic resonance imaging (MRI).

SUMMARY

An approach is presented to solve the two-dimensional Fredholm integral of the first kind with tensor product structure from a limited number of MR measurements. The method can be used to dramatically speed up MR relaxometry by allowing image reconstruction from a vastly reduced number of data points. This can be done by incorporating compressive sensing to fill in missing measurements, using a priori knowledge of the structure of the data. A compressed data matrix can be recovered from measurements that form a tight frame, and it can be established that these measurements satisfy the restricted isometry property (RIP). Recovery can be done from, for example, as few as 10% of the total measurements. The zeroth-order regularization minimization problem can then be solved, for example, using a 2D ILT approach based on the Venkataramanan-Song-Hürlimann algorithm.

DETAILED DESCRIPTION

1. Introduction

Figure 1:
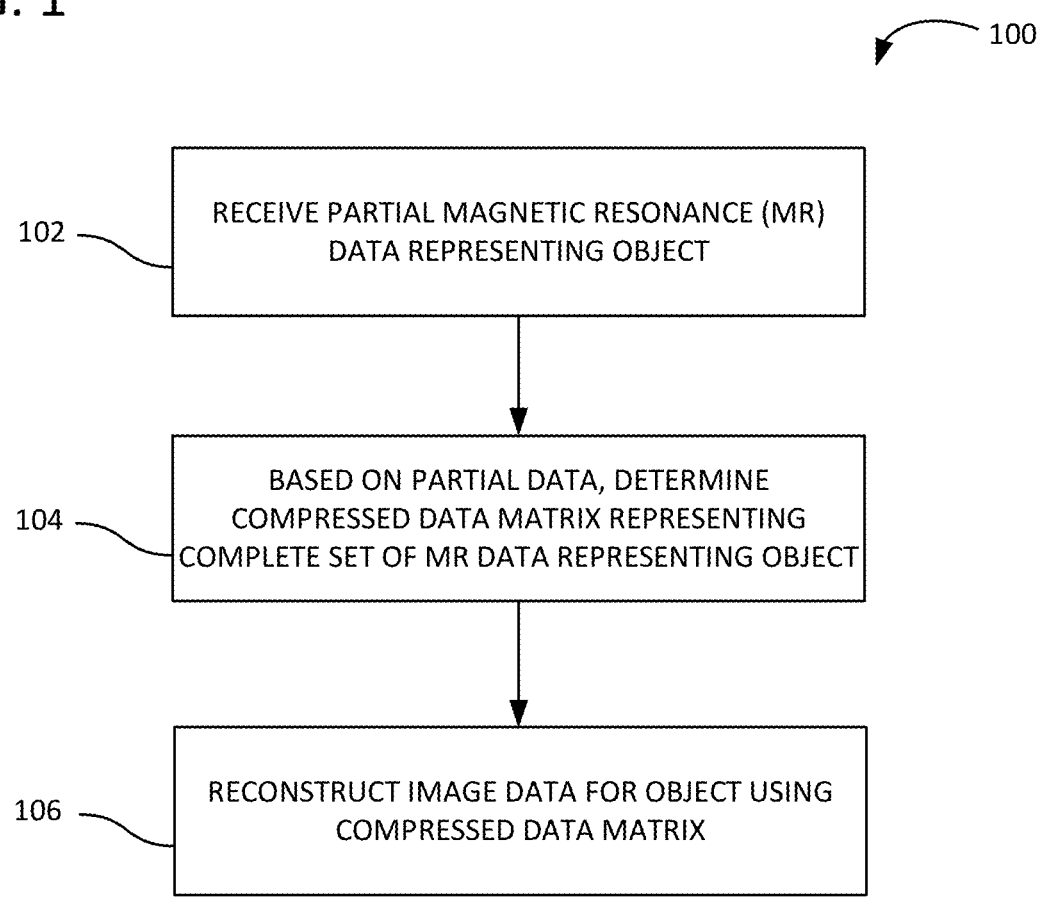
FIG. 1 illustrates an example method of reconstructing image data from partial magnetic resonance data.

An approach is presented for solving the 2D Fredholm integral of the first kind from a limited number of measurements. This is particularly useful in MR applications such as those producing 2D diffusion/relaxation spectral maps, where making a sufficient number of measurements to reconstruct a 2D spectral image through conventional approaches takes several hours. As used herein, an "image" is a reconstructed representation of MR measurements, including, for example, 2D relaxometry maps obtained within a single or multiple pixels or voxels.

Throughout this document, a distinction is made between "partial" MR data, that can be used to reconstruct images of an object under study using the described novel approaches, and "complete" data that is sufficient to allow reconstruction of images of an object through conventional approaches. "Partial" MR data is also referred to as "limited data," "a limited number of measurements," "a reduced amount of data," etc. Similarly, "complete" data is also referred to as "a full set" of data, "a full set of measurements," etc. Complete data does not necessarily require all possible or available data points, but rather refers to the amount of data conventionally required to reconstruct an image. There are a smaller number of data points or measurements in partial data than in complete data, resulting in the acquisition time for partial data being lower than for complete data.

MR data can be acquired with and without imaging i.e., for a single voxel or for multiple voxels. In an example without imaging, MR data can be acquired for a single voxel (volume element), which can be the whole object or a defined volume of the object. In an example with imaging, an imaging volume of an object can comprise a plurality of voxels of a uniform size, and data (e.g. 2D relaxation data) can be collected on a voxel-by-voxel basis.

A complete set of MR data representing an object can comprise, for example, data for each of the plurality of voxels of a volume. A partial set of MR data can comprise, for example, at least some data for each voxel but less overall data (e.g., data or measurements for 75%, 50%, 25%, 10%, or 5% of data points in a data space corresponding to the complete set of MR data representing an object). In some examples, a partial set of MR data can include data for a subset of the voxels of a volume.

A two-dimensional Fredholm integral of the first kind is written as $$g(x,y) = \iint k_1(x,s) k_2(y,t) f(s,t) ds dt, \quad (1)$$

where $k_1$ and $k_2$ are continuous Hilbert-Schmidt kernel functions and $f, g \in L^2(\mathbb{R}^2)$. Two dimensional Fourier, Laplace, and Hankel transforms are examples of Fredholm integral equations. Applications of these transformations arise in any number of fields, including methods for solving partial differential equations (PDEs), image deblurring, and moment generating functions. The examples described in this document focus on Laplace type transforms, where the kernel singular values decay quickly to zero, but other transforms can also be used.

In a conventional approach, a complete set of data M is measured over sampling times $\tau_1$ and $\tau_2$, and is related to the object of interest $\mathcal{F}(x, y)$ by a 2D Fredholm integral of the first kind with a tensor product kernel, $$M(\tau_1,\tau_2) = \iint k_1(x,\tau_1) k_2(y,\tau_2) \mathcal{F}(x,y) dx dy + \varepsilon(\tau_1,\tau_2), \quad (2)$$

where $\varepsilon(\tau_1, \tau_2)$ is assumed to be Gaussian white noise. In most applications, including NMR, the kernels $k_1$ and $k_2$ are explicit functions that are known to be smooth and continuous a priori. Solving a Fredholm integral with smooth kernels is an ill-conditioned problem, since the kernel's singular values decay quickly to zero. In such a situation, small variations in the data can lead to large fluctuations in the solution.

For MR applications, $\mathcal{F}(x,y)$ represents the joint probability density function of the variable x and y. Specifically in NMR, x and y can be the measurements of the two combination of the longitudinal relaxation time $T_1$, transverse relaxation time $T_2$, diffusion coefficient(s) D and other dynamic properties. Knowledge of the correlation of these properties of a sample is used to identify its microstructure properties and dynamics.

Because of the discrete nature of the measurements obtained through MR, the discretized version of the 2D Fredholm integral is used in the described examples:

$$M = K_1 F K_2' + E, \quad (3)$$

where a complete set of data is arranged as the matrix $M \in \mathbb{R}^{N_1 \times N_2}$, matrices $K_1 \in \mathbb{R}^{N_1 \times N_x}$ and $K_2 \in \mathbb{R}^{N_2 \times N_y}$ are discretized versions of the smooth kernels $k_1$ and $k_2$, and the matrix $F \in \mathbb{R}^{N_x \times N_y}$ is the discretized version of the probability density function $\mathcal{F}(x, y)$ that is being recovered. $\mathbb{R}$ is the set of real numbers. It is also assumed that each element of the Gaussian noise matrix E is zero mean and constant variance. Since it is assumed assumed that $\mathcal{F}(x, y)$ is a joint probability distribution function, each element of $\mathcal{F}$ is non-negative.

Venkataramanan, Song, and Htirlimann proposed an efficient strategy for solving this problem given knowledge of the complete data matrix M. The approach centers around finding an intelligent way to solve the Tikhonov regularization problem, $$\hat{F} = \underset{F \geq 0}{\mathrm{argmin}} \|M - K_1 F K_{2'}\|_F^2 + \alpha \|F\|_F^2, \quad (4)$$

where $\|\cdot\|_F$ is the Frobenius norm. More details regarding the Venkataramanan, Song, and Hürlimann approach (VSH approach) can be found in Venkataramanan, L., Song, Y. & Hürlimann, M. D. "Solving Fredholm Integrals of the First Kind With Tensor Product Structure in 2 and 2.5 Dimensions," *IEEE Transactions on Signal Processing*, 50, 1017-1026 (2002). According to the VSH approach, there are three steps to solving Equation 4.

Step 1. Compress the Data: Let the singular value decomposition (SVD) of $K_i$ be $$K_i = U_i S_i V_i' \in \{1,2\}. \quad (5)$$

Because $K_1$ and $K_2$ are sampled from smooth functions $k_1$ and $k_2$, the singular values decay quickly to 0. Let $s_1$ be the number of non-zero singular values of $K_1$ and $s_2$ number of non-zero singular values of $K_2$. Then $U_i \in \mathbb{R}^{N_i \times s_i}$ and $S_i \in \mathbb{R}^{s_i \times s_i}$ for i=1, 2, as well as $V_1 \in \mathbb{R}^{N_x \times s_1}$ and $V_2 \in \mathbb{R}^{N_y \times s_2}$.

The complete data matrix M can be projected onto the column space of $K_1$ and the row space of $K_2$ by $U_1 U_1' M U_2 U_2'$. This is denoted as $\tilde{M} = U_1' M U_2$. The Tikhonov regularization problem in Equation 4 is now rewritten as $$\hat{F} = \underset{F \geq 0}{\mathrm{argmin}} \left\| U_1 \tilde{M} U_{2'} - U_1 U_1' K_1 F K_2' U_2 U_2' \right\|_F^2 + \quad (6)$$

$$\|M\|_F^2 - \left\| U_1 \tilde{M} U_2' \right\|_F^2 + \alpha \|F\|_F^2$$

$$= \underset{F \geq 0}{\mathrm{argmin}} \left\| \tilde{M} - (S_1 V_1') F (S_2 V_2')' \right\|_F^2 + \alpha \|F\|_F^2, \quad (7)$$

where Equation 7 results from $U_1$ and $U_2$ having orthogonal columns, and the second and third terms in Equation 6 being independent of F. Because $\tilde{M} \in \mathbb{R}^{s_1 \times s_2}$, the complexity of the computations is significantly reduced.

Step 2. Optimization: As used herein, "optimization" does not necessarily mean determining a "best" value and includes improvements that are not the theoretical best that can be obtained. For a given value of α, Equation 7 has a unique solution due to the second term being quadratic. An approach to finding this solution is detailed below.

Step 3. Choosing α: Once Equation 7 has been solved for a specific α, an update for α is chosen based on the characteristics of the solution in Step 2. Repeat Steps 2 and 3 until convergence. This is also detailed below.

The VSH approach assumes knowledge of the complete data matrix, M. However, in applications with NMR, there is a high cost associated with collecting all the elements of M (e.g. data corresponding to each voxel in a volume), which is a long data acquisition time. With the microstructure-related information contained in the multidimensional diffusion-relaxation correlation spectra of the biological sample and high-resolution spatial information that MRI can provide, there is a need to combine the multidimensional correlation spectra NMR with 2D/3D MRI for pre-clinical and clinical applications. Acquisition of this data, however, can take several days using the VSH method along with conventional MRI.

In practice, the potential pulse sequences for the combined multidimensional diffusion-relaxation MRI are often single spin echo (90°-180°-acquisition and spatial localization) with saturation, inversion recovery, driven-equilibrium preparation to measure $T_1$-$T_2$ correlation and diffusion weighting preparation for D-$T_2$ measurements. With these MRI pulse sequences, a single point in the two dimensional $T_1$-$T_2$ or D-$T_2$ space is acquired for each "shot", and the total time for the sampling of the $T_1$-$T_2$ or D-$T_2$ space is determined directly by the number of measurements required to recover F from Equation 6. Together with rapid MRI acquisition techniques, which can include, e.g., parallel imaging, echo planar imaging, gradient-recalled echo, sparse sampling with compressed sensing, along with a vastly reduced number of sample points in M, could reduce the total experiment time sufficiently to make the novel approach described herein practicable for pre-clinical and clinical in vivo studies.

Notice that, despite collecting all $N_1 \times N_2$ data points in M, Step 1 of the VSH approach immediately throws away a large amount of that information, reducing the number of data points to a matrix of size $s_1 \times s_2$. $\tilde{M}$ is effectively a compressed version of the original M, containing the same information in a smaller number of entries. Use of a compressive sensing type approach, as is described herein, enables determination of $\tilde{M}$ without collecting all of M. To accomplish this, signals that are "compressible," meaning that the signal is sparse in some basis representation, are undersampled. The problem of recovering M falls into a subset of this field known as low-rank matrix completion.

An n×n matrix X that is rank r requires approximately nr parameters to be completely specified. If r<<n, then X is seen as being compressible, as the number of parameters needed to specify it is much less than its $n^2$ entries. It is less clear how to recover X from a limited number of coefficients efficiently. But it is possible to recover X from, up to a constant, nrlog (n) measurements by employing a simple optimization problem.

The approaches described herein incorporate matrix completion in order to recover $\tilde{M}$ from significantly fewer measurements than the VSH approach. Section 2, below, examines how recovery of $\tilde{M}$ fits into existing theory and shows that data from the 2D Fredholm integral can be recovered from, for example, as little as 10% of the measurements. Section 3 covers the practical considerations of the problem and discusses reconstruction error. Section 4 covers the described approach that solves the low-rank minimization problem and inverts the 2D Fredholm integral to obtain F. Section 5 shows the effectiveness of this reconstruction on simulated data. Section 6 provides detailed simulation and experimental results.

2. Data Recovery Using Matrix Completion
2.1 Matrix Completion Overview

Matrix completion deals with trying to recover a matrix $X_0 \in \mathbb{R}^{n_1 \times n_2}$ from only a fraction of the $N_1 \times N_2$ measurements required to observe each element of a complete data matrix M. Without any additional assumptions, this is an ill-posed problem. An assumption to attempt to make the problem well-posed is to assume that $X_0$ is low rank.

Let $X_0$ be rank r. Consider a linear operator $\mathcal{A} : \mathbb{R}^{n_1 \times n_2} \to \mathbb{R}^m$. Then observations take the form $$y = \mathcal{A}(X_0) + z, \|z\|_2 \leq \varepsilon, \tag{8}$$

where z represents a noise vector that is typically white noise, though not necessarily.

The naive way to proceed would be to solve the non-linear optimization problem $$\min \text{rank}(Z)$$

$$\text{such that } \|\mathcal{A}(Z) - y\|_2 \leq \varepsilon \tag{9}.$$

However, the objective function rank(Z) makes the problem NP-hard. So instead the convex envelope of the rank function is defined.

Let $\sigma_i(X)$ be the $i^{th}$ singular value of a rank r matrix X. Then the nuclear norm of X is $$\|X\|_* := \sum_{i=1}^{r} \sigma_i(X). \tag{10}$$

An attempt is then made to solve the convex relaxation of Equation 9, $$\min \|Z\|_*$$

$$\text{such that } \|\mathcal{A}(Z) - y\|_2 \leq \varepsilon. \tag{11}$$

As with traditional compressive sensing, there exists a restricted isometry property (RIP) over the set matrices of rank r. A linear operator $\mathcal{A} : \mathbb{R}^{n_1 \times n_2} \to \mathbb{R}^m$ satisfies the RIP of rank r with isometry constant $\delta_r$, if, for all rank r matrices X, $$(1-\delta_r)\|X\|_F \leq \|\mathcal{A}(X)\|_2 \leq (1+\delta_r)\|X\|_F. \tag{12}$$

The RIP has been shown to be a sufficient condition to solve Equation 11. Theorem 2.3. Let $X_0$ be an arbitrary matrix in $\mathbb{C}^{m \times n}$. Assume $\delta_{5r} < 1/10$. Then the $\hat{X}$ obtained from solving Equation 11 obeys $$\|\hat{X} - X_0\|_F \leq C_0 \frac{\|X_0 - X_{0,r}\|_*}{\sqrt{r}} + C_1 \varepsilon, \tag{13}$$

where $X_{0,r}$ is the best r rank approximation to $X_0$, and $C_0$, $C_1$ are small constants depending only on the isometry constant.

This means that, if the measurement operator $\mathcal{A}$ is RIP, then reconstruction via convex optimization behaves stably in the presence of noise. This result is useful in the context of the 2D Fredholm problem, as inversion of the Fredholm integral is very sensitive to noise. Equation 13 helps to ensure that reconstructed data behaves stably and will not create excess noise that would cause issues in the inversion process.

2.2 Matrix Completion Applied to NMR
For an example NMR problem:

$$M = K_1 F K_2' + E \tag{14}$$

$$= U_1 \tilde{M}_0 U_2' E,$$

where $U_i \in \mathbb{R}^{N_i \times s_i}$, $\tilde{M} \in \mathbb{R}^{s_1 \times s_2}$, and $E \in \mathbb{R}^{N_1 \times N_2}$. This means that $$\tilde{M}_0 = S_1 V_1' F V_2 S_2. \tag{15}$$

To subsample the data matrix M, it is observed on random entries. Let $\Omega \subset \{1, \ldots N_1\} \times \{1, \ldots N_2\}$ be the set of indices where M is observed. For $|\Omega|=m$, let the indices be ordered as $\Omega=\{(i_k,j_k)\}_{k=1}^{m}$. Then a masking operator $\mathcal{A}_\Omega$ is defined as $$\mathcal{A}_\Omega: \mathbb{R}^{N_1 \times N_2} \to \mathbb{R}^m \quad (16)$$

$$(\mathcal{A}_\Omega(X))_k = X_{i_k j_k} \quad (17)$$

Recall that the goal is to recover $\tilde{M}_0$. This means that the actual sampling operator is $$\mathcal{R}_\Omega: \mathbb{R}^{s_1 \times s_2} \to \mathbb{R}^m \quad (18)$$

$$\mathcal{R}_\Omega(X) = \mathcal{A}_\Omega(U_1 X U_2') \quad (19)$$

Now the problem of speeding up NMR can be written as an attempt to recover $\tilde{M}_0$ from measurements $$y = \mathcal{R}_\Omega(\tilde{M}_0) + e, \|e\|_2 \le \varepsilon. \quad (20)$$

Note that the VSH approach assumes $\Omega = \{1, \ldots N_1\} \times \{1, \ldots N_2\}$, making the sampling operator $\mathcal{R}_\Omega(\tilde{M}) = U_1 \tilde{M} U_2'$.

Then in the notation of this NMR problem, our recovery step takes the form $$\min \|Z\|_*$$

such that $\|\mathcal{R}_\Omega(Z) - y\|_2 \le \varepsilon$. (21)

Now the question becomes whether $\mathcal{R}_\Omega$ satisfies RIP. As discussed above, RIP is a sufficient condition for an operator to satisfy the noise bounds used in Equation 13. These noise bounds ensure that solving Equation 21 yields an accurate prediction of $\tilde{M}$. For this reason, the rest of this section focuses on proving that $\mathcal{R}_\Omega$ is an RIP operator.

First, the notion of a Parseval tight frame is defined. A Parseval tight frame for a d-dimensional Hilbert space $\mathcal{H}$ is a collection of elements $\{\phi_j\}_{j \in J} \subset \mathcal{H}$ for an index set J such that $$\Sigma_{j \in J} |\langle f, \phi_j \rangle|^2 = \|f\|^2, \forall f \in H. \quad (22)$$

This automatically forces $|J| \ge d$.

This definition is very closely related to the idea of an orthonormal basis. In fact, if $|J|==d$, then $\{\phi_j\}_{j \in J}$ would be an orthonormal basis. This definition can be thought of as a generalization. Frames have the benefit of giving overcomplete representations of the function $f$, making them much more robust to errors and erasures than orthonormal bases. This redundancy is taken advantage of below in Theorem 2.6.

Also, a bounded norm Parseval tight frame with incoherence $\mu$ is a Parseval tight frame $\{\phi_j\}_{j \in J}$ on $\mathbb{C}^{d \times d}$ that also satisfies $$\|\phi_j\|^2 \le \mu \frac{a}{|J|}, \forall j \in J. \quad (23)$$

Note that, in the case of $\{\phi_j\}_{j \in J}$ being an orthonormal basis, $|J|=d^2$, reducing the bound in Equation 23 to $\|\phi_j\|^2 \le \mu/d$.

Now notice that for an NMR problem, ignoring noise, each observation can be written as $$M_{j,k} = (u_1^j) \tilde{M}_0 (u_2^k)' \quad (24)$$

$$= \langle (u_1^j)'(u_2^k), \tilde{M}_0 \rangle, \quad (25)$$

where $u_1^j$ (resp. $u_2^j$) is the $j^{th}$ row of $U_1$ (resp. $U_2$). Noting that $U_1$ and $U_2$ are left orthogonal (ie. $U_i' U_i = \text{Id}_{s_i}$), it can be shown that $$\{(u_1^j)'(u_2^k)\}_{(j,k) \in Z_{N_1} \times Z_{N_2}}$$

forms a Parseval tight frame for $\mathbb{R}^{s_1 \times s_2}$. Also, because $K_1$ and $K_2$ are discretized versions of smooth continuous function, $\{(u_1^j)'(u_2^k)\}$ are a bounded norm frame for a reasonable constant $\mu$ ($\mu$ is discussed further in Section 3.2 below). Thus, $\mathcal{R}_\Omega$ is generated by randomly selecting measurements from a bounded norm Parseval tight frame.

The above provides the necessary notation to state a theorem, which establishes bounds on the quality of reconstruction from Equation 21 in the presence of noise. The theorem and proof assume the measurements to be orthonormal basis elements.

It is interesting to note that, because the measurements are overcomplete ($|J| > s_1 s_2$), the system of equations is not necessarily underdetermined. However, Equation 15 still gives guarantees on how the reconstruction scales with the noise, regardless of this detail. In conventional compressive sensing, the goal is to show that an underdetermined system still has a solution, which is stable. In the approaches described herein, it is shown that, regardless of whether or not the system is underdetermined, reconstruction is stable in the presence of noise, and the reconstruction error decreases monotonically with the number of measurements.

Theorem 2.6: Let $\{\phi_j\}_{j \in J} \subset \mathbb{C}^{s_1 \times s_2}$ be a bounded norm Parseval tight frame, with incoherence parameter $\mu$. Let $n = \max(s_1, s_2)$, and let the number of measurements m satisfy a $$m \ge C \mu r n \log^5 n \cdot \log |J|, \quad (26)$$

where C is a constant. Let the sampling operator $\mathcal{R}_\Omega$ be defined for $\Omega \subset J$, with $\Omega = \{i_1, \ldots i_m\}$ as $$\mathcal{R}_\Omega: \mathbb{C}^{s_1 \times s_2} \to \mathbb{C}_m, \quad (27)$$

$$(\mathcal{R}_\Omega(X))_j = \langle \phi_{i_j}, X \rangle \; j=1, \ldots, m. \quad (28)$$

Let measurements y satisfy Equation 20. Then with probability greater than $1 - e^{-c\delta^2}$ over the choice of $\Omega$, the solution $\tilde{M}$ to Equation 21 satisfies $$\|\tilde{M} - \tilde{M}_0\|_F \le C_0 \frac{\|\tilde{M}_0 - \tilde{M}_{0,r}\|_*}{\sqrt{r}} + C_1 p^{-1/2} \varepsilon, \quad (29)$$

where $$p = \frac{m}{|J|}.$$

To prove this result, a lemma is needed that establishes that the measurements satisfy RIP. Lemma 2.7: let $\{\phi_j\}_{j \in J} \subset \mathbb{C}^{s_1 \times s_2}$ be a bounded norm Parseval tight frame, with incoherence parameter pt. Fix some $0 < \delta < 1$. Let $n = \max(s_1, s_2)$, and let the number of measurements m satisfy $$m \ge C \mu r n \log^5 n \cdot \log |J|, \quad (30)$$

where $C \propto 1/\delta^2$. Let the sampling operator $\mathcal{R}_\Omega$ be defined for $\Omega \subset J$, with $\Omega = \{i_1, \ldots, i_m\}$ as $$\mathcal{R}_\Omega : \mathbb{C}^{s_1 \times s_2} \to \mathbb{C}^m, \tag{31}$$

$$(\mathcal{R}_\Omega(X))_j = \langle i_j, X \rangle, j=1, \ldots, m. \tag{32}$$

Then with probability greater than $1-e^{-c\delta^2}$ over the choice of $\Omega$, $$\sqrt{\frac{|J|}{m}} \mathcal{R}_\Omega$$

satisfies the RIP of rank r with isometry constant $\delta$.

The idea here is to generalize the measurements to a bounded norm Parseval tight frame.

Proof of Theorem 2.6: Assume that Lemma 2.7 is true. Lemma 2.7 states that $$\sqrt{\frac{|J|}{m}} \mathcal{R}_\Omega$$

satisfies the RIP. However, Equation 21 is stated using only $\mathcal{R}_\Omega$ as the measurement operator.

This means that a scaling factor of $$\sqrt{\frac{|J|}{m}}$$

is included to understand the noise bound. Let $$p = \frac{m}{|J|} = \frac{m}{N_1 N_2}$$

be the percentage of elements observed. Then, to utilize RIP, a solution to the following problem is attempted $$\min \|Z\|_*$$

such that $\|p^{-1/2} \mathcal{R}_\Omega(Z) - p^{-1/2} y\|_2 \le p^{-1/2} \varepsilon$. (33)

While scaling by a constant does not affect the result of the minimization problem, it does provide a better understanding of the error in the reconstruction.

Theorem 2.3 provides that reconstruction error is bounded by a constant multiple of the error bound. But Equation 33 means the error bound can be rewritten as $$\|\tilde{M} - \tilde{M}_0\|_F \le C_0 \frac{\|\tilde{M}_0 - \tilde{M}_{0,r}\|_*}{\sqrt{r}} + C_1 p^{-1/2} \varepsilon, \tag{34}$$

thus attaining the desired inequality.

Examination of the proof of Lemma 2.7 shows that the bound on m in Equation 30 is actually not sharp. Rather, m is actually bounded below by a factor of log m. This term is overestimated with log|J| for simplicity. However, in reality the bound is $$m \ge C\lambda \mu rn \log^5 n \cdot \log m. \tag{35}$$

Let $N = C\lambda \mu rn \log^5 n$. This would give the bound $m \ge e^{-W_{-1}(-1/N)}$, where $W_{-1}$ is the lower branch of the Lambert W function. Taking the first three terms of a series approximation of $W_{-1}$ in terms of $\log(1/N)$ and $\log(\log(N))$ provides $$\begin{aligned} m &\ge e^{-\log(1/N)} e^{\log(\log(N))} e^{-\frac{\log(\log(N))}{\log(1/N)}} \\ &= N \log(N) e^{-\frac{\log(\log(N))}{\log(1/N)}} \\ &= C\lambda \mu rn \log^5 n \cdot \log(C\lambda \mu rn \log^5 n) \cdot e^{\frac{\log(\log(C\lambda \mu rn \log^5 n))}{\log(C\lambda \mu rn (\log^5 n))}}. \end{aligned} \tag{36}$$

Note that taking three terms is sufficient as each subsequent term is asymptotically small compared to the previous. The bound in Equation 36 is more intricate than simply bounding by $m \ge C\lambda \mu rn \log^5 n \log|J|$, but for typical sizes of $|J|$ in the Fredholm integral setting, this results in m decreasing by less than 5% from its original size.

3. Numerical Considerations

Section 2 gives theoretical guarantees about error in estimating $\tilde{M}_0$ with the recovered $\tilde{M}$. This section addresses implementation issues. Let $\tilde{M}_0$ be the original compressed data matrix for which recovery is attempted, and let $\tilde{M}$ be the approximation obtained by solving Equation 21 for the sampling operator $\mathcal{R}_\Omega$. We consider the guarantee given in Equation 13 term by term.

For the examples discussed herein, the kernels $K_1$ and $K_2$ are assumed to be Laplace type kernels with quickly decaying singular values. The kernels $k_1(\tau_1, x) = 1 - e^{-\tau_1/x}$ and $k_2(\tau_2, y) = e^{-\tau_2/y}$ can be used to represent the general data structure of most multi-exponential NMR spectroscopy measurements, where x and y are one of T1, T2, D, or other MR parameters, and $\tau_1$ and $\tau_2$ are mixing times, although other kernels are also possible. Here it is assumed that $\tau_1$ is logarithmically sampled between 0.0005 and 4 and $\tau_2$ is linearly sampled between 0.0002 and 0.4, as these are typical values in practice. Also for this section, F is taken to be a two peak distribution, namely Model 3 from Section 5.

When needed, it is set that $s_1 = s_2 = 20$. This choice is determined by the discrete Picard Condition (DPC). For ill-conditioned kernel problems $Kf = g$, with $\{u_i\}$ denoting left singular vectors of K and $\{\sigma_i\}$ the corresponding singular values, the DPC guarantees the best reconstruction of $f$ is given by keeping all $\sigma_i \ne 0$ such that $$\frac{|u_i^* g|}{\sigma_i}$$

on average decays to zero as $\sigma_i$ decrease. For the kernels with tensor product structure in Equation 3, the $s_1 = s_2 = 20$ rectangle provides a close estimate for what fits inside this curve of the relevant singular values and vectors to keep. implying that at a minimum set $s_1 = s_2 = 20$ could be set to satisfy DPC for a stable inversion. DPC provides a stronger condition than simply keeping the largest singular values, or attempting to preserve some large percentage of the energy.

3.1 Noise Bound in Practice

Theorem 2.3 incorporates the assumption that $\delta_{5r} < 1/10$, where $\delta_r$ is the isometry constant for rank r. This puts a constraint on the maximum size of r. The maximal rank is denoted by $r_0$. If it were known a priori that $\tilde{M}_0$ were at most rank $r_0$, then this term of $$\frac{\|\tilde{M}_0 - \tilde{M}_{0,r}\|_*}{\sqrt{r}}$$

would have zero contribution, as $\tilde{M}_0 = \tilde{M}_{0,r}$. However, because of Equation 15, $\tilde{M}_0$ could theoretically be full rank, since $S_1$ and $S_2$ are decaying but not necessarily 0.

This problem can be rectified by utilizing the knowledge that $K_1$ and $K_2$ have rapidly decaying singular values. This means $\tilde{M}_0$ from Equation 15 has even more rapidly decaying singular values, as $V_1'FV_2$ is multiplied by both $S_1$ and $S_2$. The singular values of $\tilde{M}_0$ drop to zero almost immediately for a typical compressed data matrix.

This means that even for small $r_0$, $$\frac{\|\tilde{M}_0 - \tilde{M}_{0,r}\|_*}{\sqrt{r}} \leq \left\|\sum_{i=r_0+1}^{\min(s_1,s_2)} \sigma_1(\tilde{M}_0)\right\|$$

is very close to zero, as the tail singular values of $\tilde{M}_0$ are almost exactly zero.

Figure 4:
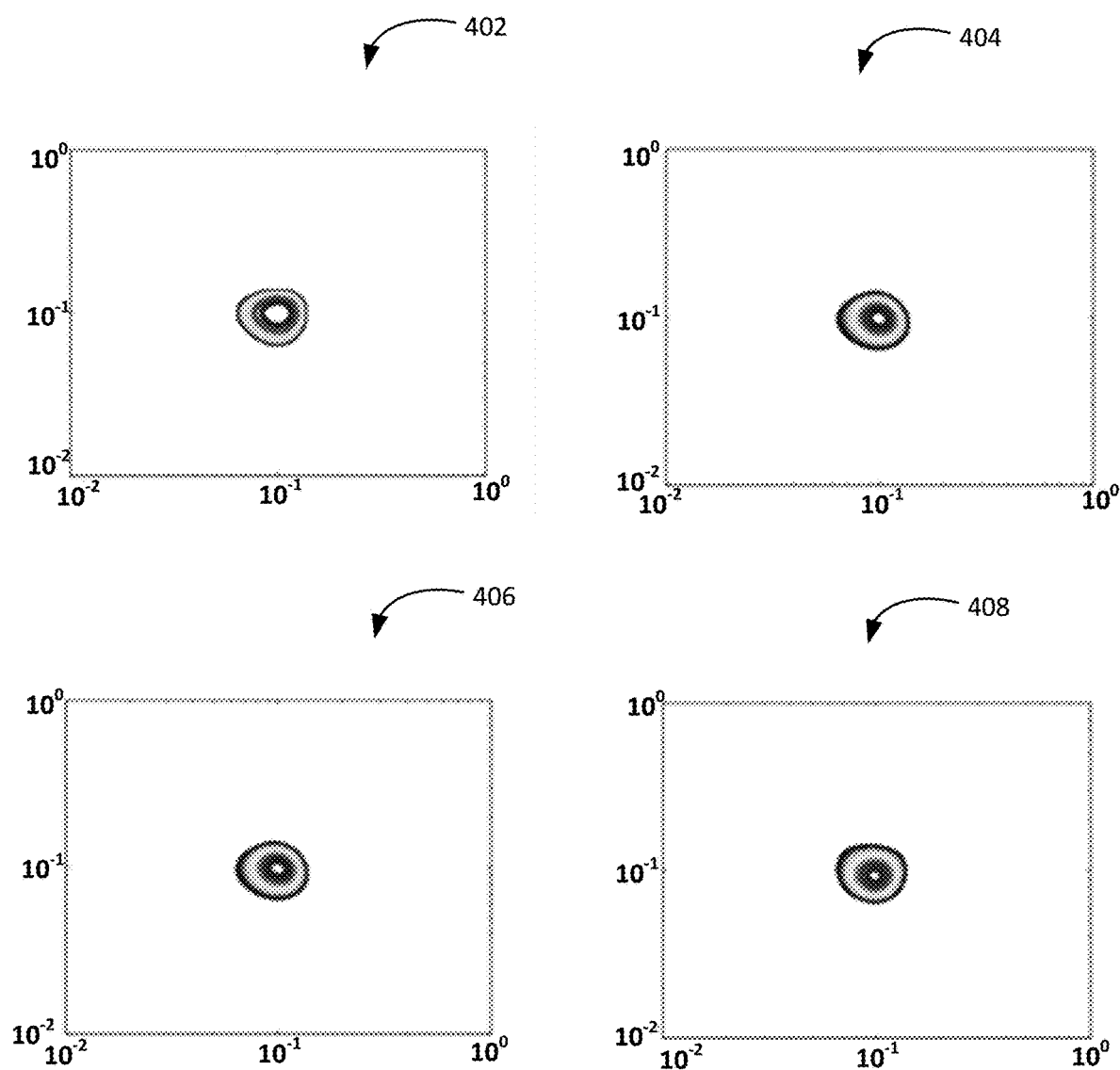
FIG. 4 illustrates image reconstruction simulation results for a model in which F(x,y) is a small variance Gaussian distribution with a signal-to-noise ratio (SNR) of 30 dB.

FIG. 4 shows how the relative error decays for larger percentages of measurement, and how that curve matches the predicted curve of $p^{-1/2}\|e\|_2$. One can see from this curve that the rank r error does not play any significant role in the reconstruction error.

3.2 Incoherence

The incoherence parameter $\mu$ to bound the number of measurements in Equation 30 plays is used in determining m in practice. It determines whether the measurements $\{u_i, v_j\}$ are viable for reconstruction from significantly reduced m, even though they form a Parseval tight frame.

Using the $K_1$ and $K_2$ discussed above, it can be shown that $\mu$ does not make reconstruction prohibitive.

The $$\|\phi_j\|^2 \frac{|J|}{n}$$

can be calculated for each measurement $\{u_i, v_j\}$ from the above description, making $$\mu = \max\|\phi_j\|^2 \frac{|J|}{n} = 89.9.$$

While this bound on $\mu$ is not ideal, as it makes $m > n^2$, there are two notes to consider. First, as was mentioned in Section 2.2, Theorem 2.3 ensures strong error bounds regardless of whether the system is underdetermined. Second, the estimated $\tilde{M}$ is still significantly better than a simple least squares minimization (that could also be used), which in theory applies as the system isn't underdetermined.

Also note that mean $$\left(\|\phi_j\|^2 \frac{|J|}{n}\right)$$

and median $$\left(\|\phi_j\|^2 \frac{|J|}{n}\right)$$

differ greatly from $$\max\left(\|\phi_j\|^2 \frac{|J|}{n}\right).$$

This implies that, while a small number of the entries are somewhat problematic and coherent with the elementary basis, the vast majority of terms are perfectly incoherent. This implies that Theorem 2.3 is a non-optimal lower bound on m.

4. Example Approaches

The approaches described here solve for F in Equation 3 from partial MR data. FIG. 1 illustrates a computer-implemented magnetic resonance method 100. In process block 102, a partial set of magnetic resonance data representing an object is received. The MR data can be, for example, relaxometry data. In process block 104, based on the partial set of magnetic resonance data, a compressed data matrix is determined that represents a complete set of magnetic resonance data representing the object. The compressed data matrix is determined without knowledge of the complete set of magnetic resonance data. In process block 106, image data for the object is reconstructed using the compressed data matrix. In some examples, reconstructing image data for the object comprises performing a two-dimensional inverse transform, such as an inverse Laplace transform, on the compressed data matrix. Image data can be any data that can be processed through image processing or other techniques to generate an image. Image data can also include, for example, 2D spectra data. Method 100 can also comprise generating an image, for example a 2D spectral map (e.g., a 2D relaxometry map), representing the object using the image data reconstructed from process block 106. Although 2D Laplace transforms (and 2D inverse Laplace transforms) are discussed in this document, other transforms such as 2D Hankel transforms and 3D and higher dimensional transforms can also be used.

The complete set of magnetic resonance data comprises a first amount of data, and the partial set of magnetic resonance data comprises a second amount of data. In some examples, the second amount is less than half of the first amount. The second amount can also be, for example, 25%, 10%, 5%, etc. of the first amount. A volume of the object can comprise a plurality of voxels (volume elements). The plurality of voxels can be of a uniform size. In some examples, the partial set of MR data comprises at least some data for each of the plurality of voxels.

As an example, in a 2D relaxometry acquisition process, an inversion time and an echo time can be set, and data can be acquired for each voxel. This process can be repeated for additional inversion times and echo times. The data for the different inversion times and echo times for each voxel is complete MR data (i.e. 2D relaxometry data) for an object. The data points (i.e. voxel and echo time/inversion time combinations for which data can be acquired) that correspond to complete MR data can be thought of as forming a data space. That is, the data space represents all of the individual data points for which MR data can be acquired. In some examples, data points corresponding to the partial set of MR data can be selected as data points for which data is collected by randomly sampling the data space.

In some examples, the complete set of magnetic resonance data representing the object comprises data for a first number of the plurality of voxels of the volume, and the partial set of magnetic resonance data representing the object comprises data for a second number of the plurality of voxels of the volume. In some examples, the second number is less than half of the first number. The second number can also be, for example, less than one fourth of the first number. Other examples are also possible (e.g., the second number can be approximately 10% of the first number, etc.). In some examples, the voxels of the second number of voxels, corresponding to the partial set of magnetic resonance data, are selected as voxels for which data is gathered by randomly sampling the plurality of voxels of the volume of the object.

In some examples, method 100 comprises selecting a subset of voxels of a volume of an object for magnetic resonance data acquisition. The partial set of magnetic resonance data received in process block 102 can correspond to acquired data for the selected subset of voxels. The subset of voxels can be selected by randomly sampling the voxels of the volume of the object.

The magnetic resonance data can be, for example, two-dimensional magnetic resonance relaxometry data, including $T_1$-$T_2$, $T_2$-$T_2$, D-$T_2$, D-D, D-$T_1$, or $T_1$-$T_1$ data, or 2D data that includes other MR parameters. Determining the compressed data matrix can comprise minimizing both (i) a nuclear norm of a minimization matrix having a same rank as the compressed data matrix and (ii) a norm of a term relating the received partial set of magnetic resonance data to the minimization matrix. The minimizing can be accomplished through singular value thresholding.

Figure 2:
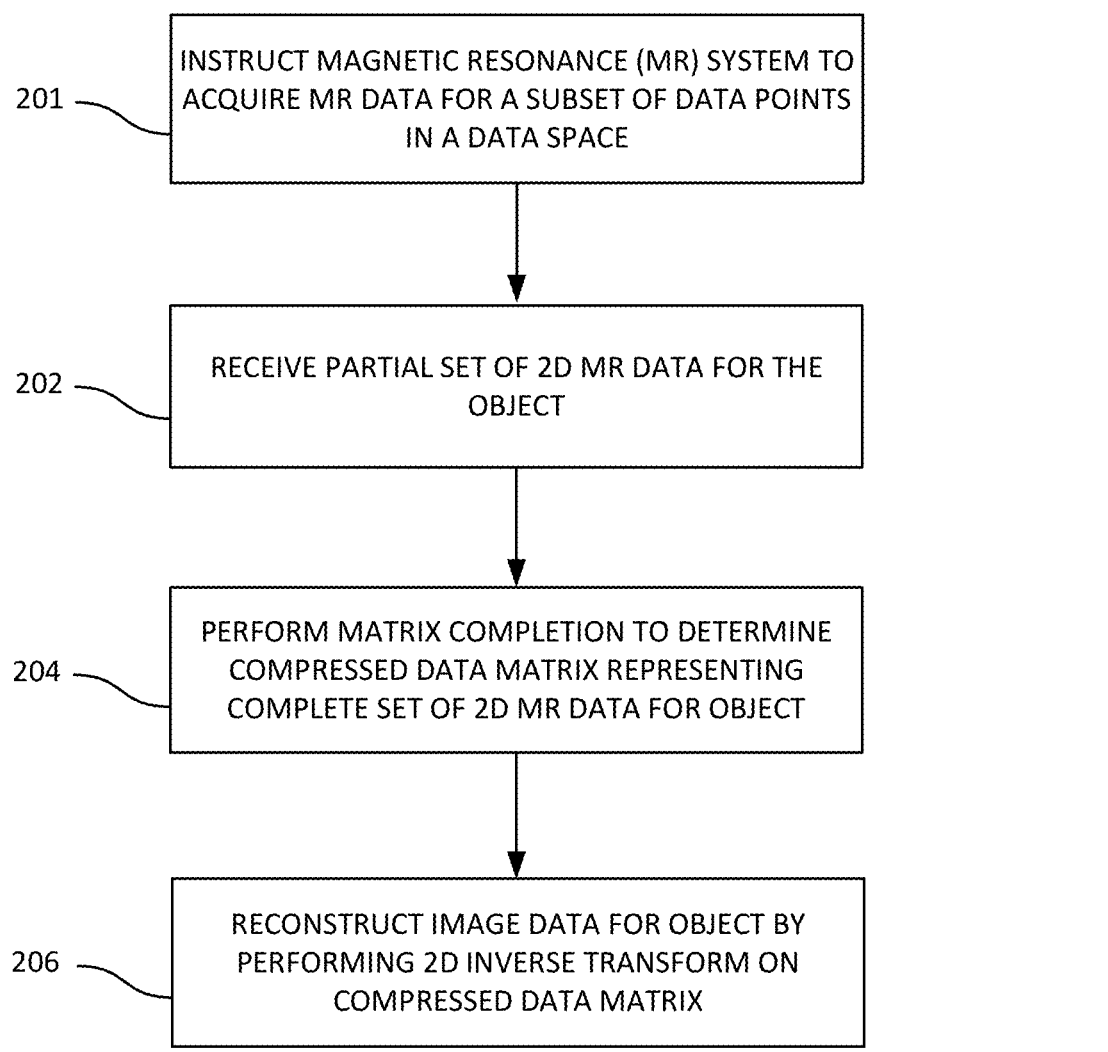
FIG. 2 illustrates an example method of reconstructing image data from partial 2D magnetic resonance data.

FIG. 2 illustrates an approach 200 for processing magnetic resonance data. In process block 201, an MR system is instructed to acquire a partial set of data comprising at least some data for each voxel of a volume or the whole volume occupied by an object. The data can be, for example, 2D spectra data (e.g. $T_1$-$T_2$ correlation data). In some examples, data points corresponding to the partial set of magnetic resonance data are selected as data points for which data is collected by randomly sampling a data space representing a complete set of magnetic resonance data for the object. In process block 202, a partial set of 2D MR data for the object is received.

Based on the partial set of 2D MR data, matrix completion is performed in process block 204 to determine a compressed data matrix that represents a complete set of 2D magnetic resonance data for. Matrix completion can comprise determining a compressed data matrix that represents the complete set of 2D MR data for by minimizing both (i) a nuclear norm of a minimization matrix having a same rank as the compressed data matrix and (ii) a norm of a term relating a measurement operator to the received partial set of 2D magnetic resonance data. In process block 206, image data, such as 2D spectra, for the object is reconstructed by performing a 2D inverse transform, such as an inverse Laplace transform, on the compressed data matrix. The partial set of 2D MR data can be related to the image data by a 2D Fredholm integral expression, the 2D Fredholm integral expression including kernel functions that reflect the physical relaxation of excited nuclei.

4.1 Example Detailed Approach

Determining a compressed data matrix, $\tilde{M}$, from given measurements, y: Let $y = \mathcal{R}_\Omega(\tilde{M}_0) + e$ be the set of observed measurements, as in Equation 20. Even though Section 2 makes guarantees for solving Equation 21, the relaxed Lagrangian form can instead be solved $$\text{Min}(\mu\|X\|_* + \tfrac{1}{2}\|\mathcal{R}_\Omega(X) - y\|_2^2). \tag{37}$$

In Equation 37, the first portion, $\mu\|X\|_*$, is the nuclear norm of a minimization matrix X having a same rank as the compressed data matrix $\tilde{M}$. The second portion is the norm ($L_2$ norm) of a term relating the received partial set of MR data y to the minimzation matrix X. As discussed previously, $\mu$ is incoherence. Regarding the second portion of Equation 37, $\mathcal{R}_\Omega$ is a measurement operator, which is defined in Section 2.2 as being based on a masking operator $\mathcal{A}_\Omega$ applied to the projection of a complete data matrix M based on a singular value decomposition (SVD) of the kernel functions $K_1$ and $K_2$ as shown, for example, in Equations 14 and 15 of Section 2.2. Equation 19 of Section 2.2 shows that $\mathcal{R}_\Omega(X) = \mathcal{A}_\Omega(U_1 X U_2')$. Because it is based on kernel functions $K_1$ and $K_2$, the measurement operator $\mathcal{R}_\Omega$ reflects the physics of MR.

Figure 3:
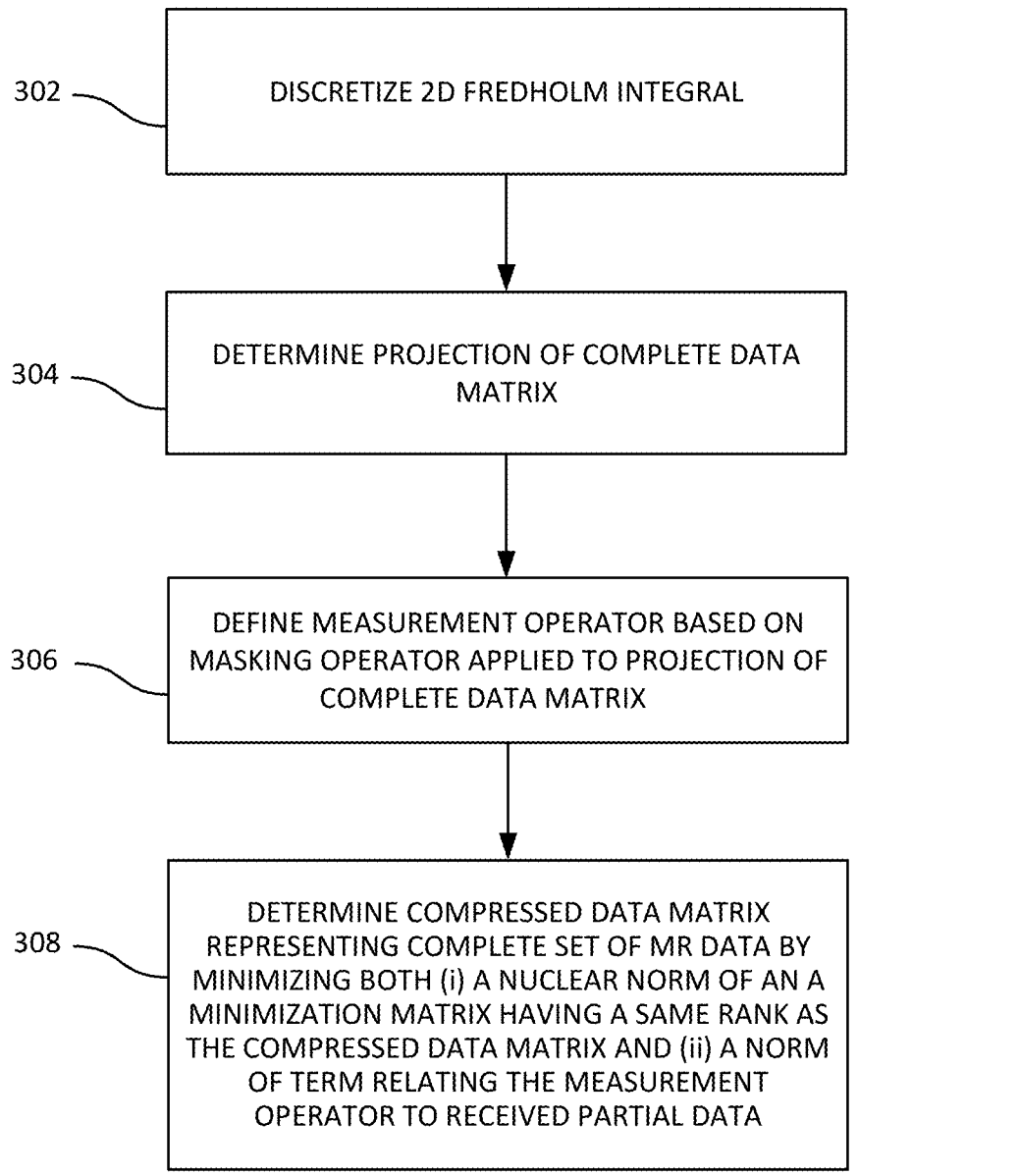
FIG. 3 illustrates an example method of determining a compressed data matrix representing a complete set of magnetic resonance (MR) data based on a partial set of MR data.

The approach of Equation 37 is illustrated in FIG. 3 as method 300. In process block 302, a 2D Fredholm integral expression is discretized. The expression is based on kernel functions that reflect the physics of MR. In process block 304, a projection of a complete data matrix is determined. The projection is based on a SVD of the kernel functions. A measurement operator is defined in process block 306 based on a masking operator applied to the projection of the complete data matrix. A compressed data matrix that represents the complete set of MR data for an object is then determined in process block 308 by minimizing both (i) a nuclear norm of a minimization matrix having a same rank as the compressed data matrix and (ii) a norm of a term relating the measurement operator to the received data.

The minimization to solve Equation 37 can be accomplished through a singular value thresholding approach. An example singular value thresholding approach is illustrated in Equations 38-40, below.

Let the matrix derivative of the $L_2$ norm term be written as $$g(X) = \mathcal{R}_\Omega^*(\mathcal{R}_\Omega(X) - y) \tag{38}$$
$$= U_1, (\mathcal{A}_\Omega^*(\mathcal{A}_\Omega(U_1 X U_2') - y))U_2.$$

The singular value threshholding operator $\mathcal{S}_v$ reduces each singular value of some matrix X by v. In other words, if the SVD of $X = U\Sigma V'$, then $$\mathcal{S}_v(X) = U \sum{}' V', \quad \sum{}'_{i,j} = \begin{cases} \max\left(\sum_{i,i} -v, 0\right) & i = j, \\ 0 & \text{otherwise.} \end{cases} \tag{39}$$

Using this notation, a two step iterative process can be used. Choose a $\tau > 0$. Then, for any initial condition, solve the iterative process $$\begin{cases} Y^k = X^k - \tau g(X^k) \\ X^{k+1} = \mathcal{S}_{\tau\mu}(Y^k) \end{cases} \tag{40}$$

This approach converges to the correct solution. Certain values of $\tau$ and $\mu$ can be selected to accelerate convergence.

This means that, given partial observations y, the iteration approach in Equation 40 converges to a matrix $\tilde{M}$, which is a good approximation of $\tilde{M}+0$. Once $\tilde{M}$ has been generated, F can be recovered by solving $$\underset{F\geq 0}{\operatorname{argmin}}\left\|\tilde{M}-(S_1V_{1'})F(S_2V_{2'})'\right\|_F^2+\alpha\|F\|_F^2. \qquad (41)$$

Optimization: For a given value of a regularization parameter $\alpha$, Equation 41 has a unique solution due to the second term being quadratic. This constrained optimization problem can then be mapped onto an unconstrained optimization problem for estimating a vector c.

Let $f$ be the vectorized version of F and m be a vectorized version of $\tilde{M}$. Then the vector c can be defined from $f$ implicitly by $$f=\max(0,K'c), \text{ where } K=(S_1V_1,)\otimes(S_2V_2,). \qquad (42)$$

Here, $\otimes$ denotes the Kronecker (outer) product of two matrices. This definition of c comes from the constraint that F≥0 in Equation 41, which can now be reformed as the unconstrained minimization problem $$\min\left(\frac{1}{2}c'[G(c)+\alpha I]c-c'm\right), \qquad (43)$$

where $$G(c)=K\begin{bmatrix}H(K_{1,\cdot}'c) & 0 & \ldots & 0 \\ 0 & H(K_{2,\cdot}'c) & \ldots & 0 \\ \vdots & \vdots & & \vdots \\ 0 & 0 & \ldots & H(K_{N_x\times N_y,\cdot}'c)\end{bmatrix}K', \qquad (44)$$

and H(x) is the Heaviside function. Also, $K_{i,\cdot}$ denotes the $i^{th}$ row of K. The optimization problem in Equation 43 can be solved using a simple gradient descent approach.

Choosing $\alpha$: There are several methods for choosing the optimal value of $\alpha$.

BRD Method: Once an iteration of the optimization above has been completed, a better value of a can be calculated by $$\alpha_{opt}=\frac{\sqrt{s_1 s_2}}{\|c\|}. \qquad (45)$$

If one iterates between Step 2 and the BRD method, the value of a converges to an optimal value. This method is very fast, however it can have convergence issues in the presence of large amounts of noise, as well as on real data.

S-Curve: Let $F_\alpha$ be the value returned from the optimization for a fixed $\alpha$. The choice of a should be large enough that $F_\alpha$ is not being overfitted and unstable to noise, yet small enough that $F_\alpha$ actually matches reality. This is done by examining the "fit-error"

$$\chi(\alpha)=\|M-K_1F_\alpha K_2\|_F. \qquad (46)$$

This is effectively calculating the standard deviation of the resulting reconstruction. Plotting $\chi(\alpha)$ for various values of a generates an S-curve. The interesting value of a occurs at the bottom "heel" of the curve $$\left(\text{i.e.,} \frac{d\log\chi(\alpha)}{d\log\alpha}\approx .1\right).$$

This is because, $\alpha_{heel}$, the fit error is no longer demonstrating overfitting as it is to the left of $\alpha_{heel}$, yet is still matching the original data, unlike to the right of $\alpha_{heel}$. This method is slower than the BRD method, however it is usually more stable in the presence of noise. For many of the examples described herein, the S-curve method is used for choosing a.

5. Example Simulations

In example simulations, the kernels $k_1(\tau_1, x)=1-e^{-\tau_1/x}$ and $k_2(\tau_2, y)=e^{-\tau_2/y}$ are used and sample $\tau_1$ logarithmically and $\tau_2$ linearly, as described in Section 3. The simulations involve inverting subsampled simulated data to recover the density function F(x, y). Three models of F(x, y) are tested. In model 1, F(x, y) is a small variance Gaussian. In model 2, F(x, y) is a positively correlated density function. In model 3, F(x, y) is a two peak density, one peak being a small circular Gaussian and the other being a ridge with positive correlation.

The data is generated for a model of F(x, y) by discretizing F and computing $M=K_1FK_2$, +E (Equation 3) where E is Gaussian noise. That data is then randomly subsampled by only keeping $\lambda$ fraction of the entries.

Each true model density F(x, y) is sampled logarithmically in x and y. $\tau_1$ is logarithmically sampled $N_1=30$ times, and $\tau_2$ is linearly sampled $N_2=4000$ times. Each model is examined for various SNR and values of $\lambda$ and $\alpha$ is chosen using the S-curve approach for each trial.

The signal-to-noise ratio (SNR) for the data is defined to be $$SNR=10\log_{10}\frac{\|M\|^2}{\|E\|^2}dB. \qquad (47)$$

These simulation examples focus on the differences between the F generated from full knowledge of the data and the F generated from partial subsampled data. For this reason, $F_{full}$ refers to the correlation spectra generated from full knowledge of the data using the VSH approach, and $F_\lambda$ refers to the correlation spectra generated from only $\lambda$ fraction of the measurements using the described novel approaches.

5.1 Model 1

In this model, F(x, y) is a small variance Gaussian. This is the simplest example of a correlation spectra, given that the dimensions are uncorrelated. $\mathcal{F}(x, y)$ is centered at (x, y)=(0.1, 0.1) and have standard deviation 0.02. The maximum signal amplitude is normalized to 1. This model of $\mathcal{F}(x, y)$ is a base case for any algorithm. In other words, approaches to invert the 2D Fredholm integral will be successful in this case.

Figure 5:
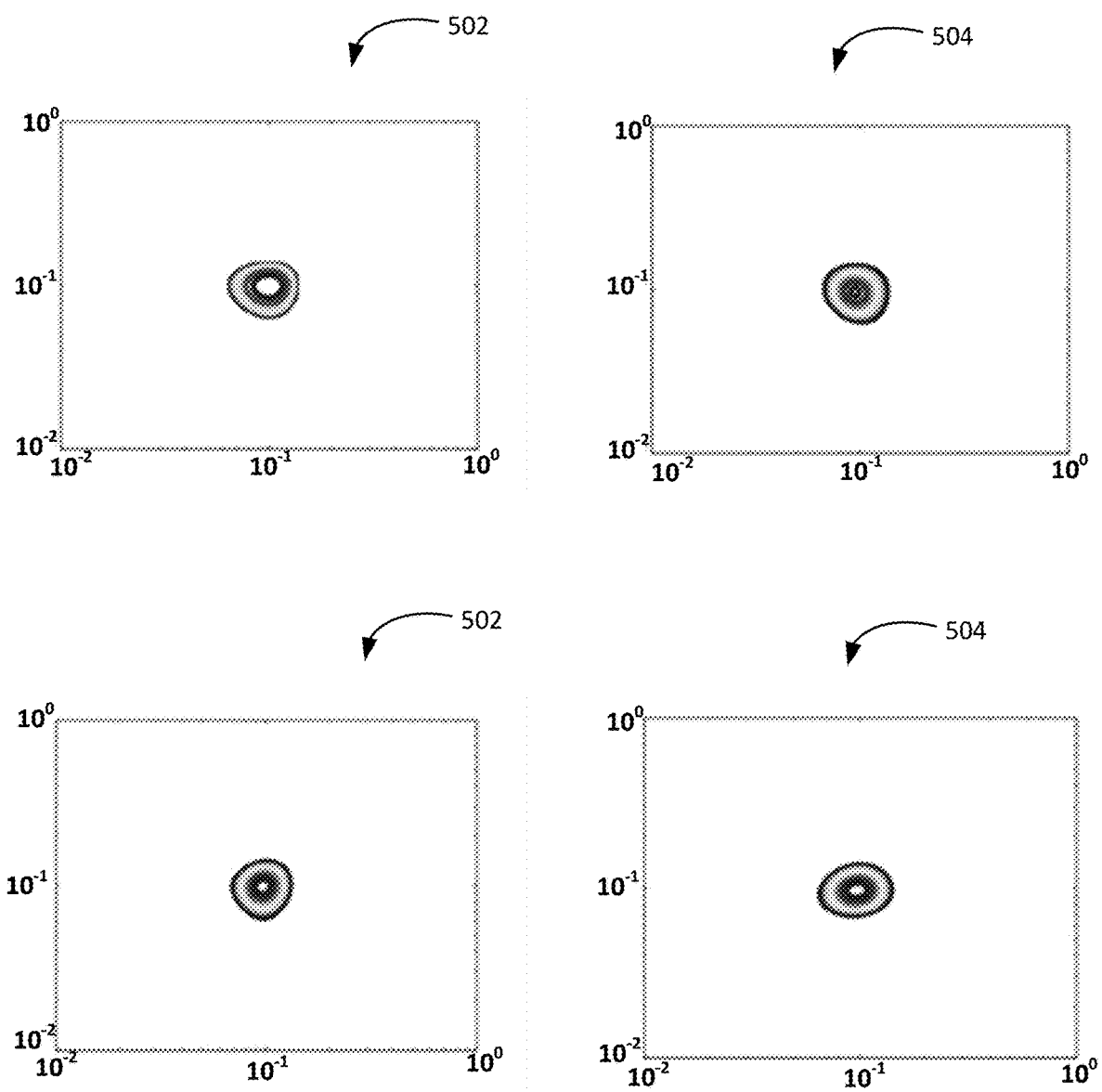
FIG. 5 illustrates image reconstruction simulation results for a model in which F(x,y) is a small variance Gaussian distribution with an SNR of 15 dB.

FIG. 4 shows the quality of reconstruction of a simple spectra with an SNR of 30 dB. FIG. 5 shows the same spectra, but with an SNR of 15 dB. Almost nothing is lost in either reconstruction, implying that both the VSH approach and the example novel approaches of reconstruction from partial data are very robust to noise for this simple spectra. Plot 402 in FIG. 4 illustrates the true spectra; plot 404 illustrates $F_{full}$, plot 406 illustrates reconstruction from 30% of measurements, and plot 408 illustrates reconstruction from 10% of measurements. In FIG. 5, plot 502 illustrates the true spectra; plot 504 illustrates $F_{full}$, plot 506 illustrates reconstruction from 30% of measurements, and plot 508 illustrates reconstruction from 10% of measurements.

5.2 Model 2

In this model, $\mathcal{F}(x, y)$ is a positively correlated density function. The spectrum has a positive correlation, thus creating a ridge through the space. $\mathcal{F}(x, y)$ is centered at $(x, y)=(0.1, 0.1)$, with the variance in x+y direction being 7 times greater than the variance in the x−y direction. The maximum signal amplitude is normalized to 1. This is an example of a spectra where considering the two dimensional image provides more information. A projection onto one dimension would yield an incomplete understanding of the spectra, as neither projection would convey that the ridge is very thin. This is a more practical test of the novel approaches described herein.

Figure 6:
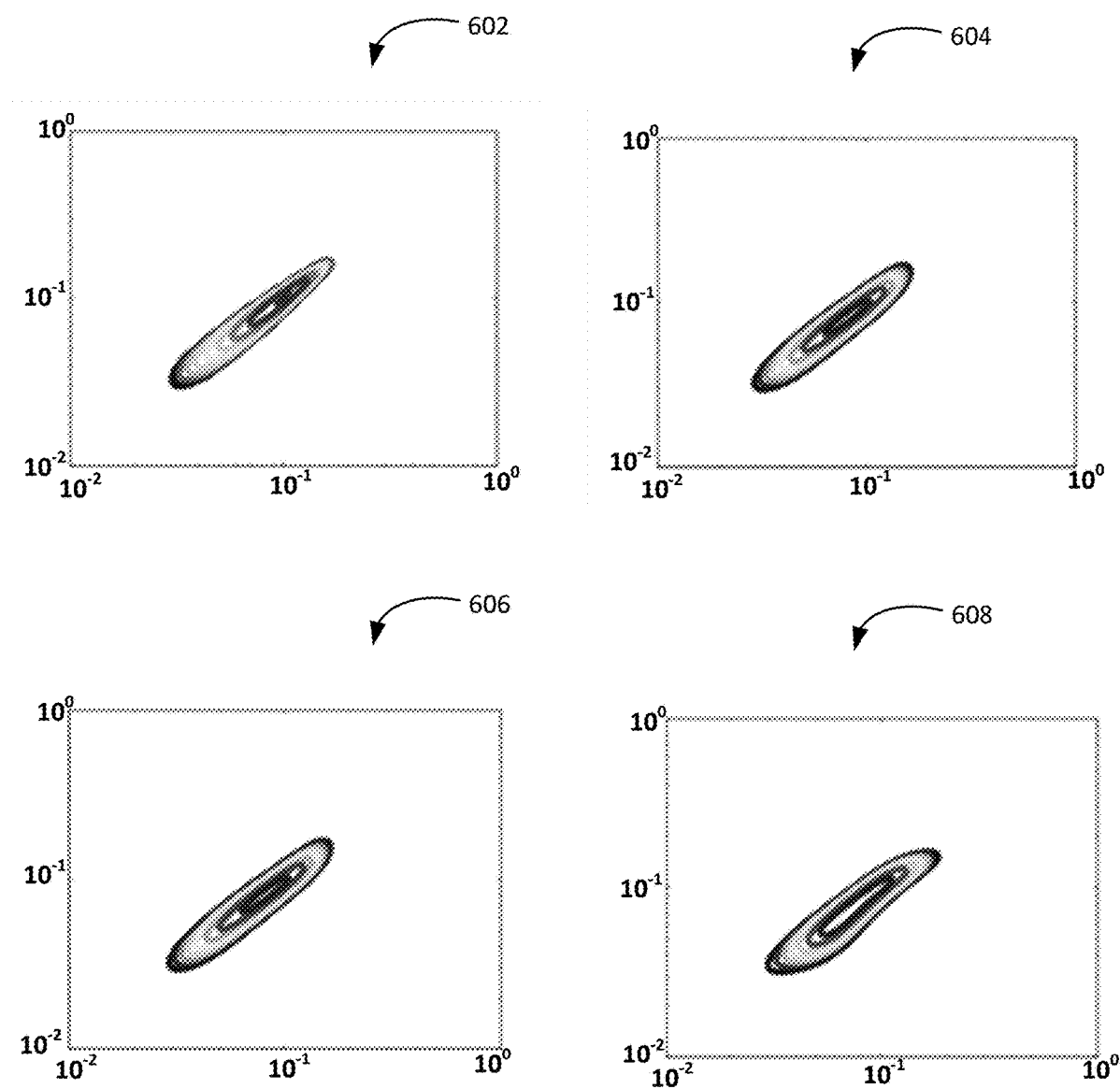
FIG. 6 illustrates image reconstruction simulation results for a model in which F(x,y) is a positively correlated density function with an SNR of 30 dB.
Figure 7:
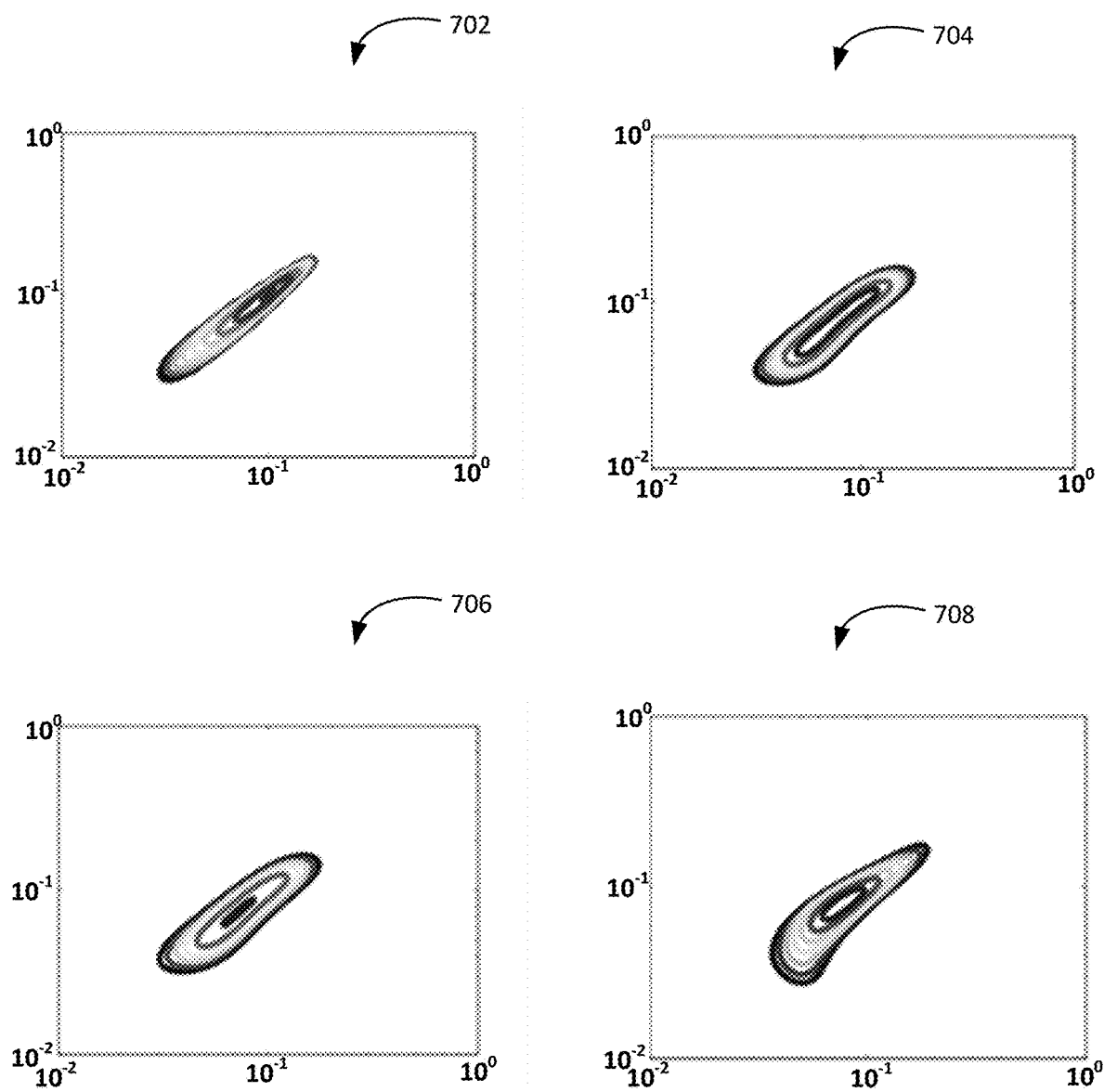
FIG. 7 illustrates image reconstruction simulation results for a model in which F(x,y) is a positively correlated density function with an SNR of 20 dB.

FIG. 6 shows the quality of reconstruction of a correlated spectra with an SNR of 30 dB. FIG. 7 shows the same spectra, but with an SNR of 20 dB. There is slight degradation in the 10% reconstruction, but the reconstructed spectrum is still incredibly close to $F_{full}$. Overall, both of these figures show the quality of reconstruction according to the novel examples relative to using the full data. Plot 602 in FIG. 6 illustrates the true spectra; plot 604 illustrates $F_{full}$, plot 606 illustrates reconstruction from 30% of measurements, and plot 608 illustrates reconstruction from 10% of measurements. In FIG. 7, plot 702 illustrates the true spectra; plot 704 illustrates $F_{full}$, plot 706 illustrates reconstruction from 30% of measurements, and plot 708 illustrates reconstruction from 10% of measurements.

5.3 Model 3

In this model, $\mathcal{F}(x, y)$ is a two peak density, with one peak being a small circular Gaussian and the other being a ridge with positive correlation. The ridge is centered at $(x, y)=(0.1, 0.1)$, with the variance in x+y direction being 7 times greater than the variance in the x−y direction. The circular part is centered at $(x, y)=(0.05, 0.4)$. The maximum signal amplitude is normalized to 1. This is an example of a common, complicated spectra that occurs during experimentation.

Figure 8:
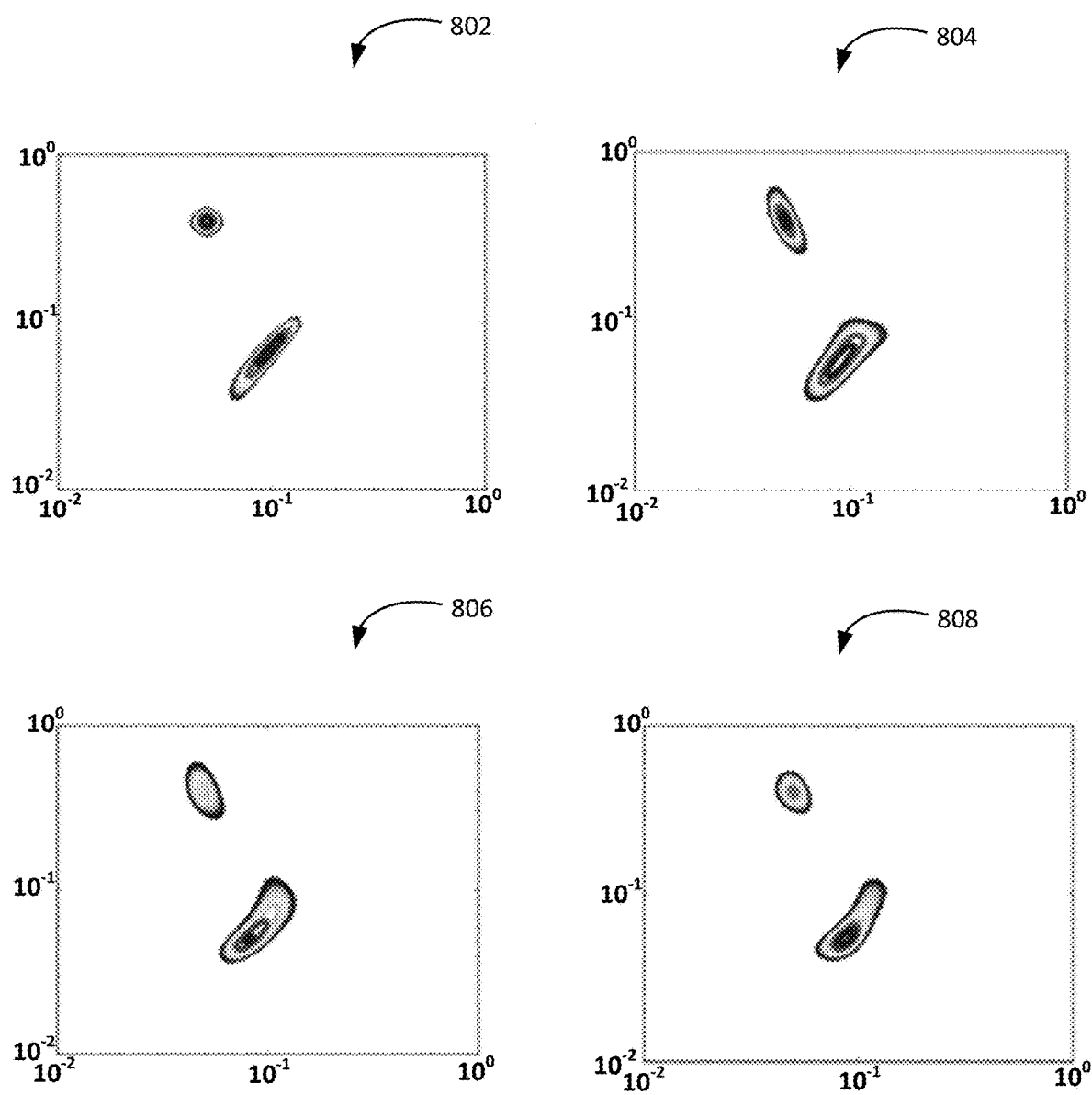
FIG. 8 illustrates image reconstruction simulation results for a model in which F(x,y) is a two-peak density function with an SNR of 30 dB.

FIG. 8 shows the quality of reconstruction of a two peak spectra with an SNR of 35 dB. In this instance, there is some degradation from $F_{full}$ to any of the reconstructed data sets. Once again, there is slight degradation in the 10% model, but the reconstructions from partial data are still very close matches to $F_{full}$. Plot 802 in FIG. 8 illustrates the true spectra; plot 804 illustrates $F_{full}$, plot 806 illustrates reconstruction from 30% of measurements, and plot 808 illustrates reconstruction from 10% of measurements.

The novel approaches described herein provide a matrix completion framework for solving 2D Fredholm integrals. This method allows inversion of the discretized transformation via Tikhonov regularization using far fewer measurements than previous approaches. It has been shown that nuclear norm minimization reconstruction of the measurements is stable and computationally efficient, and the resulting estimate of $\mathcal{F}(x, y)$ is consistent with using the full set of measurements. This allows, for example, a reduction in the number of measurements needed to be obtained by a factor of 5 or more.

Although the examples discussed herein refer to 2D NMR spectroscopy, the novel approaches can also be used with larger dimensional measurements, for example allowing for accelerated acquistion of 3D correlation maps that would otherwise take days to collect.

6. Example Experiments

The novel approaches to reconstructing image data based on partial MR data (also referred to herein as compressed sensing (CS) approaches) have been validated through multiple experiments, including the use of synthetic data, MR data acquired in a well-characterized urea/water phantom, and on a fixed porcine spinal cord. The CS reconstructed spectra exhibited comparable quality as conventional 2D relaxation spectra as assessed using global correlation, the local contrast between peaks, the peak amplitude and relaxation parameters, etc. bringing this important type of contrast closer to being realized in preclinical and clinical applications.

Figure 9:
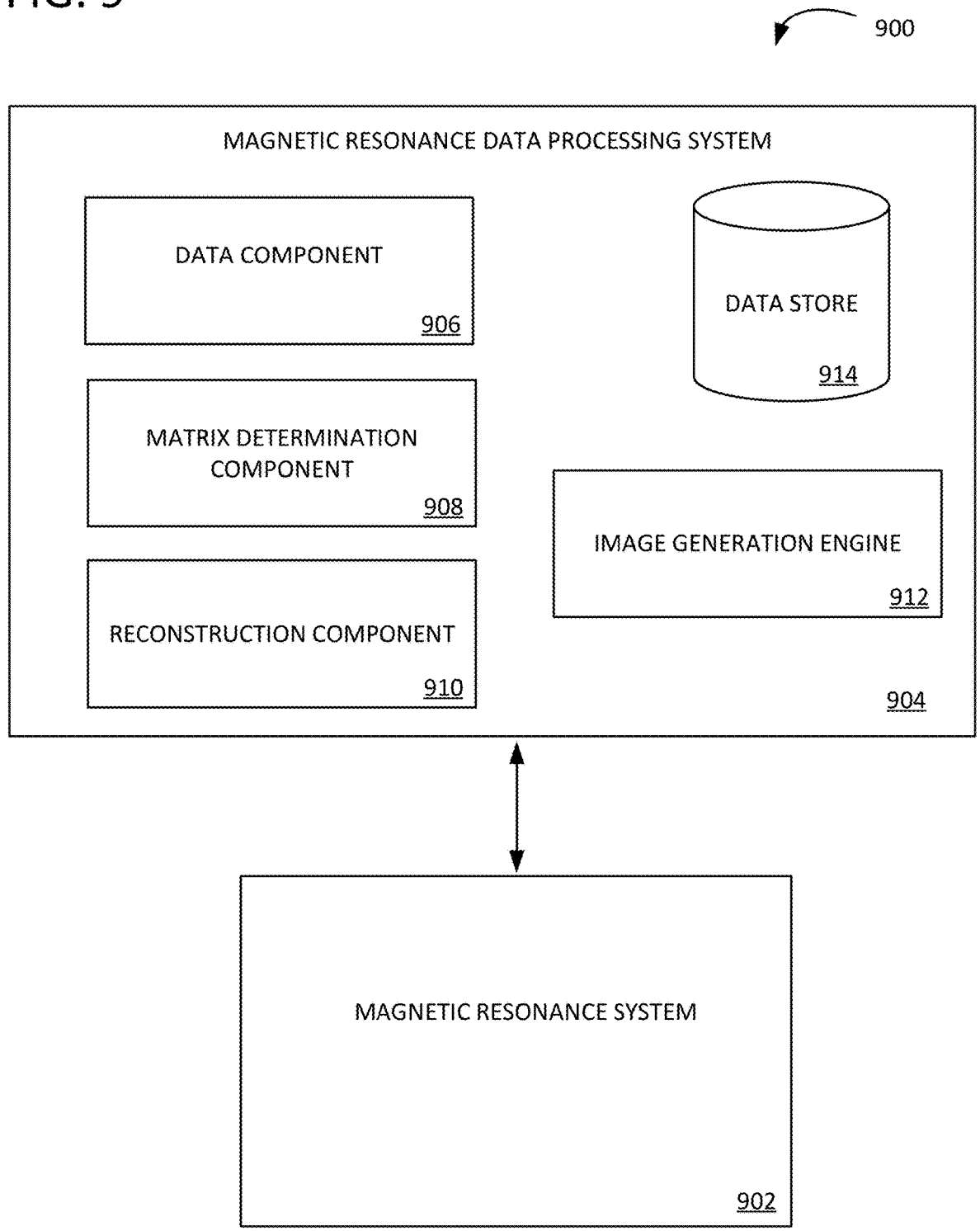
FIG. 9 is an example magnetic resonance system configured to reconstruct image data from partial MR data.

FIG. 9 illustrates an example system 900 configured to reconstruct image data from partial MR measurements. System 900 comprises magnetic resonance (MR) system 902 and MR data processing system 904. MR system 902 is operable to detect electromagnetic signals associated with nuclei excited by application of one or more magnetic fields. MR system 902 includes various hardware components (not shown) including coils for exciting and/or polarizing nuclei as well as various sensors. MR data processing system 904 is in communication with MR system 902 either locally and/or over a network (not shown). MR data processing system 904 can be implemented, for example, on one or more server computers or other computing devices.

A data component 906 is configured to receive a partial set of two-dimensional (2D) magnetic resonance data for the object, the partial set of 2D magnetic resonance data generated using MR system 902. The partial set of MR data can comprise at least some measurements corresponding to each of the voxels forming the volume of the object. A matrix determination component 908 is configured to determine a compressed data matrix that represents a complete set of 2D magnetic resonance data for each voxel of the object based on the partial set of 2D magnetic resonance data received by data component 906. A reconstruction component 910 is configured to reconstruct image data, such as 2D spectra, for the object by performing a 2D inverse transform, such as a 2D inverse Laplace transform, on the compressed data matrix.

An image generation engine 912 is configured to generate an image, such as a 2D spectral map, representing the object using the reconstructed image data. MR data processing system 904 also includes a data store 914, which can store data received from MR system 902 as well as intermediate data created by MR data processing system 904, reconstructed image data, and/or images, such as spectral maps, generated from the reconstructed image data. The various components of MR data processing system 904 can be in communication with data store 914.

6.1 Overview

The described approaches to reconstructing image data based on partial MR data were verified using MR data obtained on a 7T vertical wide-bore Bruker MRI scanner similar to those used in preclinical imaging applications. Both $T_1$-$T_2$ and $T_2$-$T_2$ relaxometry NMR data were acquired on a well-characterized urea/water phantom, which shows two exchanging components. $T_1$-$T_2$ MRI relaxometry was performed on a fixed porcine spinal cord. In addition, numerical simulations of the 2D relaxation spectra were also used to assess the effects of noise on the CS-based reconstruction of the 2D-ILT.

6.2 Materials and Methods 6.2.1 Experiments 6.2.1.1 Urea/Water Phantom

An aqueous urea model system has been chosen for this study since it has two distinguishable types of protons in the transverse relaxation time (urea proton has a shorter $T_2$ than water proton) and urea is highly soluble in water. A 7M-urea solution was made by dissolving urea powder (Sigma-Aldrich, Inc., USA) into phosphate buffered saline (PBS, pH=7.4) resulting in an urea/water proton ratio of 20%/80%. Then, 0.2 mM Gd-DTPA (Magnevist®; Berlex, Inc.) and 0.025 μM MnCl$_2$ were added to the urea solution to reduce relaxation times. The pH of the urea solution was titrated to 8.1 with NaOH. 80 μL solution was then transferred to the 5 mm susceptibility-matching Shigemi tube (Shigemi Inc., Japan) for NMR experiments. All the NMR experiments were completed within 24 hours after the solution was made to ensure stability of the phantom.

6.2.1.2 Porcine Spinal Cord

Porcine spinal cord was excised after necropsy and immediately immersion fixed in a 4% formalin solution. Prior to the MRI experiments, the spinal cord was fully rehydrated with PBS and then placed within a 10 mm susceptibility-matching Shigemi NMR tube (Shigemi Inc., Japan) with Fluorinert (3M, St. Paul, Minn.) filling the unoccupied spaces during the MRI experiments.

6.2.1.3 NMR and MRI Measurements

Both the NMR measurements of the urea phantom and the MRI experiments on the fixed spinal cord were performed on a 7T Bruker vertical-bore microimaging MR scanner equipped with an Avance III console, and micro2.5 microimaging gradient system (Bruker BioSpin, Billerica, Mass.). The specimens were kept at a bore temperature (≈17° C.) during scanning.

6.2.1.4 2D NMR of Urea/Water Phantom

Two different 2D NMR relaxometry pulse sequences were performed on the urea phantom: (a) $T_1$-$T_2$ correlation relaxometry was performed using an inversion recovery (IR) preparation "filter" following by Carr-Purcell-Meiboom-Gill (CPMG) pulse trains. This IR-CPMG pulse sequence is shown as pulse sequence 1002 in FIG. 10; (b) $T_2$-$T_2$ exchange relaxometry was performed using relaxation exchange spectroscopy (pulse sequence 1004 in FIG. 10), which consists of two CPMG pulse trains separated by a mixing time, $\tau_m$, during which the magnetization is stored back along the longitudinal axis. A gradient spoiler was placed after the IR pulse in the IR-CPMG pulse sequence and the mixing period in the REXSY pulse sequence to "crush" any remaining magnetization in the transverse plane.

In the IR-CPMG pulse sequence, 50 IR points were sampled logarithmically from 50 ms to 5 s; 250 echoes were acquired in the CPMG pulse trains with a time spacing of T=2 ms. The pre-scan delay is 15 s to ensure full inversion recovery. A two-step phase cycling scheme was used (shown in pulse sequence 1004 in FIG. 10) and only one repetition was acquired. An equilibrium CPMG echo train was also acquired with an inversion delay of 15 s and 4 repetitions. In the REXSY experiments, the same CPMG parameters were used as in the IR-CPMG with the mixing time $\tau_m$ starting from 50 ms, and then 100 ms with a 100 ms step until to 1000 ms. The repetition time (TR) is 8 s.

6.2.1.5 $T_1$-$T_2$ MRI of Porcine Spinal Cord $T_1$-$T_2$ correlation relaxometry was performed by an IR-preparation multiple spin echo sequence (pulse sequence 1006 in FIG. 10) with 36 inversion-delays ($T_1$) logarithmically distributed from 260 ms to 5000 ms and 50 spin echoes starting 5 ms and continuing to 250 ms in 5 ms increments. The other acquisition parameters were: TR=inversion-delays+12 s, matrix size=64×64, slice thickness=1 mm, FOV=10 mm×10 mm with two-step phase cycling. Hermite pulse shapes were applied for both excitation and refocusing pulses with bandwidth (5400 Hz) matching and propoer gradient crasher, and a 5 ms hyperbolic secant inversion pulse was used for uniform inversion of the sample. A magnetization equilibrium scan was also acquired with an inversion-delay equal to 12 s with four repetitions.

Figure 10:
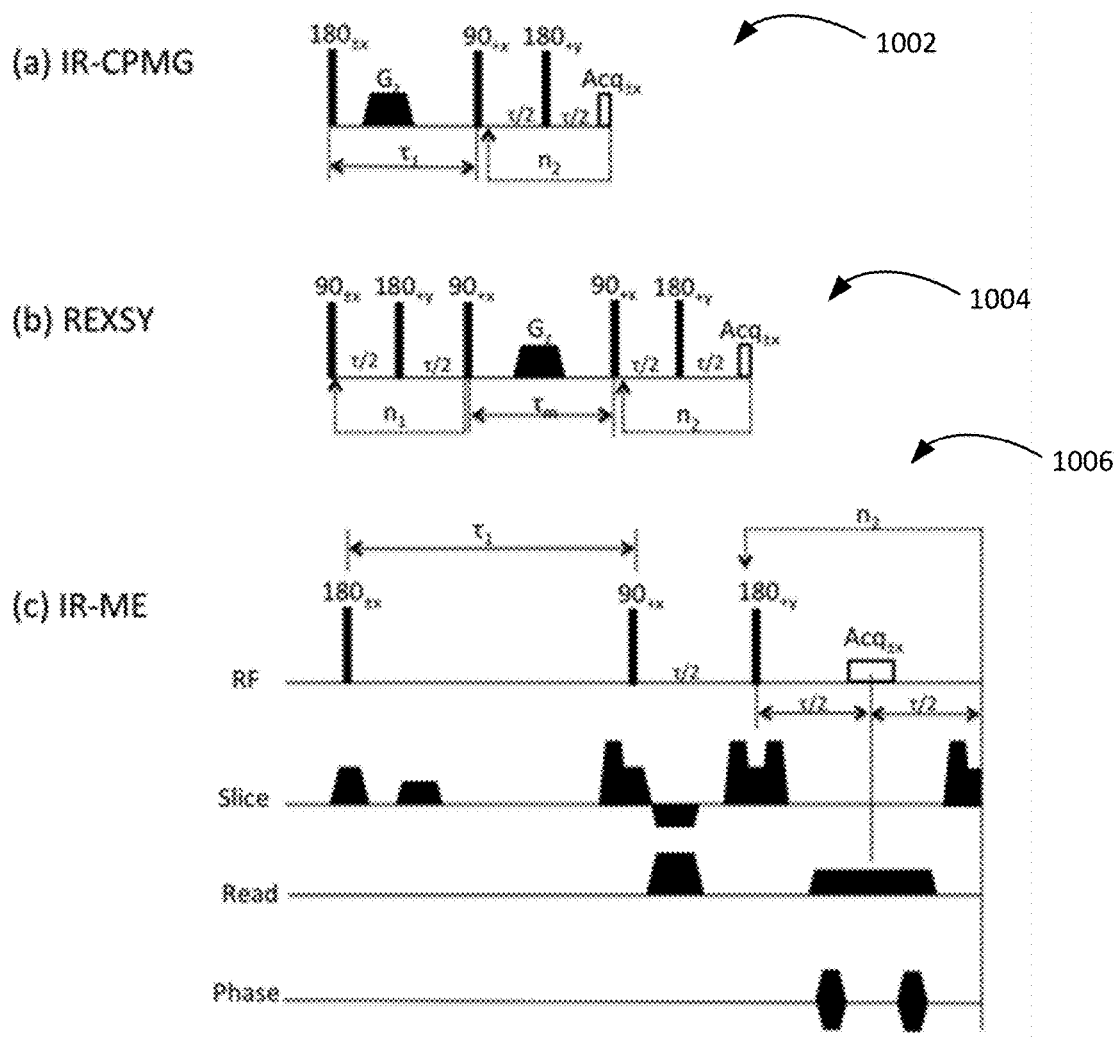
FIG. 10 illustrates three MR pulse sequences used to validate the example approaches.

FIG. 10 illustrates pulse sequences 1002 ((a) IR-CPMG), 1004 ((b) REXSY), and 1006 ((c) IR-ME with imaging) used in these experiments. Other pulse sequences can also be used. In FIG. 10, $\tau_1$ is the inversion delay, T is the echo time in the CPMG, $\tau_m$ is the mixing time in the REXSY, $n_1$ and $n_2$ are the number of loops in the first and second dimensions.

6.2.2 Theory and Data Analysis

Figure 11:
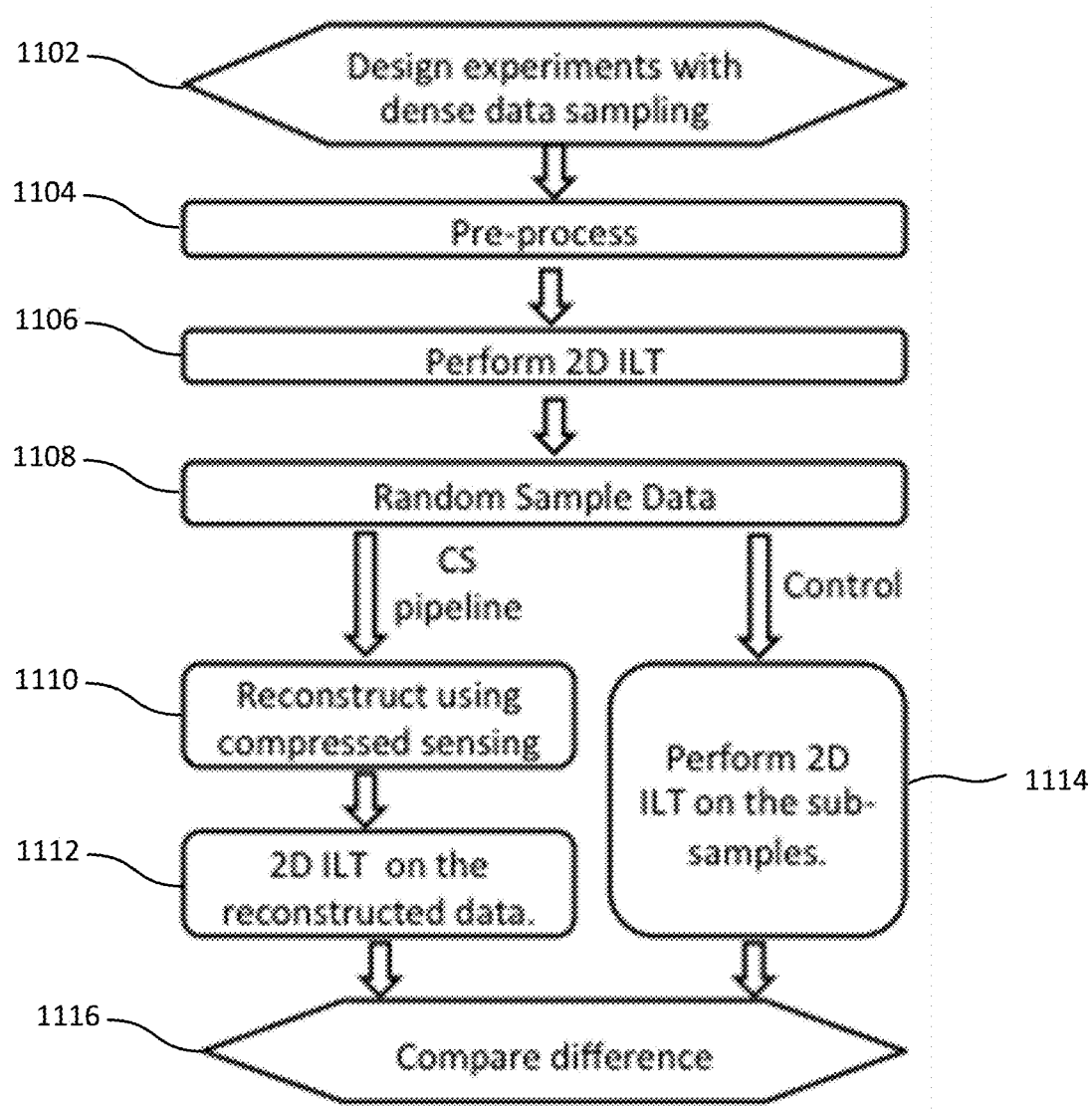
FIG. 11 illustrates a data analysis flowchart used to validate and test the example approaches.

FIG. 11 illustrates a data analysis flowchart 1100 used to validate and test the efficiency of the novel CS framework described herein. To approximate the ground truth, experiments with dense sampling points were performed in process block 1102. Raw data were preprocessed in process block 1104. After pre-processing the raw data, and performing a 2D ILT in process block 1106, random samples were obtained in process block 1108 with different acceleration factors, R (where 1/R is the fraction of the full data). The sub-samples were then reconstructed using two pipelines: CS (process blocks 1110 and 1112) and conventional 2D ILT reconstruction (process block 1114). 2D relaxation spectra from each sub-sample were then compared in process block 1116 to the result obtained from the complete data set in the experiments or the ground truth in the simulations.

6.2.2.1 Pre-Processing

To remove the bias caused by Rician noise in the IR-ME MRI data, the noisy ME MRI magnitude data were first processed to transform Rician magnitude data to Gaussian-distributed data. Furthermore, region of interest (ROI) analysis was performed to satisfy the SNR requirements of the 2D ILT, which generally needs a high SNR to obtain stable and accurate solutions. Here two ROIs in the white matter were selected having a relatively homogenous geometric mean $T_2$ ($gmT_2$).

In both the IR-CPMG and IR-ME experiments, the CPMG and ME data were subtracted from the corresponding equilibrium data to cancel the potential artifacts caused by non-perfect 180° inversion pulse. Then, the experimental data from all the three pulse sequences can be written as:

$$M(\tau_1, \tau_2) = \sum_{m=1}^{N_m} \sum_{n=1}^{N_n} F(T_m, T_n) \exp(-\tau_1/T_m) \exp(-\tau_2/T_n) + \epsilon(\tau_1, \tau_2) \quad (48)$$

where $\tau_1$ is the inversion delay in the $T_1$-$T_2$ sequences and the accumulated echo time $n_1\tau$ of the first CPMG in the $T_2$-$T_2$ sequences, $\tau_2$ is the accumulated echo time $n_2\tau$ of the second CPMG, $F(T_m, T_n)$ is the probability density function of the two corresponding relaxation parameters; $N_m$ and $N_n$, are the number of sampling points in each dimension of F, and $\epsilon(T_1, \tau_2)$ is the noise, which is assumed to be Gaussian in most 2D ILT algorithms 6.2.2.2 2D ILT 2D inversion of the Laplace transform is generally ill-conditioned, where a small change of M may result in large variations in $F(T_m, T_n)$. One practical technique to obtain a stable solution is by minimizing $\Xi$:

$$\Xi \equiv \sum_{i=1}^{N_1} \sum_{j=1}^{N_2} \left[ M(\tau_i, \tau_j) - \sum_{m=1}^{N_m} \sum_{n=1}^{N_n} F(T_m, T_n) \exp\left(-\frac{\tau_i}{T_m}\right) \exp\left(-\frac{\tau_j}{T_n}\right) \right]^2 + \quad (49)$$

-continued $$\alpha \sum_{m=1}^{N_m} \sum_{n=1}^{N_n} F(T_m, T_n)^2$$

with the non-negative constraints of F, where the second term performs Tikhonov regularization, $N_1$ and $N_2$ are the number of measurements in the first and second dimension, a is the regularization parameter.

Equation 49 can be rewritten in the form of a kernel matrix for the full data:

$$\Xi = \|M - K_1 F K'_2\|^2 + \alpha \|F\|^2 \qquad (50)$$

where $\|\cdot\|$ is the Frobenius norm of a matrix, $K_1$ and $K_2$ are the kernels of the first and second dimension with the matrix size $N_1 \times N_m$ and $N_2 \times N_n$.

Here the VSH approach was applied to solve the minimization problem. In the VSH approach, the data is compressed at first by using the singular value decomposition (SVD) of $K_i$.

$$K_i = U_i S_i V'_i \, i \in \{1,2\} \qquad (51)$$

By truncating the small singular values, $S_i$ can be reduced to a much smaller matrix with dimensions $N_i \times s_i$. Then, the data matrix M can be projected onto the column space of $K_1$ and the row space of $K_2$ with a much smaller dimension: $\tilde{M} = U'_1 M U_2$ with the new matrix size $s_1 \times s_2$. Now Equation 50 can be rewritten in an identical structure with the compressed data $\tilde{M}$ and kernels of much lower dimension.

For a given value of the regularization parameter, a, a unique solution can be obtained from Equation 49 or Equation 50 by solving the constrained optimization problem. An S-curve based method, which calculates the fitting error to the measurements $\chi(\alpha)$ with a series of $\alpha$, was used to robustly determine the optimal value of $\alpha$. The best $\alpha$ is chosen within a user-defined tolerance, TOL:

$$d(\log_{10} \chi(\alpha))/d(\log_{10} \alpha) = TOL \qquad (52)$$

Here TOL=0.1 was used for both the simulated data and the experimental data.

6.2.2.3 Sub-Sampling

After preprocessing the raw data, 1000 random samples were reconstructed with different acceleration factors, R. The sub-samples were then reconstructed using CS and the 2D ILT was applied to the reconstructed data. As a control, conventional 2D ILT without data compression was directly performed on the sub-samples as in Equation 49. The same regularization parameters were used on the subsamples as in the full data.

6.2.2.4 Comparison

A correlation coefficient was calculated between the vectorized version of the probability density function F from the full data or ground truth and one from each sub-sample to obtain global similarities between them. In addition, the geometric mean relaxation parameters and the relative volume fraction of each peak in each 2D relaxation spectrum were also calculated and compared to the results from the full data or ground truth. The statistical results of each 1000 realizations were displayed as Tukey box plots, where the notch is the median, the edges of the box are the 25$^{th}$ and 75$^{th}$ percentiles; the whisker length is 1.5 and the outliers are plotted separately. Further, the "paired student's t-test" was performed on the correlation coefficients from the results of the CS reconstruction and the control with the null hypothesis that C are equal in the results via the two methods and the alternative hypothesis that C is higher in the CS reconstruction than the control. Fisher z-transformation was applied on the correlation coefficients before the hypothesis test.

The median of the 1000 2D relaxation spectrum data from all sub-samples at each R was displayed, and the variance of the results was characterized by interquartile range (IQR). The contrast between the two peaks is defined by the ratio of the smallest amplitude between the two components over the smaller component's amplitude in the $T_2$ projection of the displayed 2D relaxometry.

6.2.3 Simulations

To further test and validate the efficiency of the proposed CS reconstruction, the $T_1$-$T_2$ relaxometry experiments were simulated by a Monte Carlo method. An identical data acquisition protocol as we used in the $T_1$-$T_2$ MRI of spinal cord was applied. Two broad peaks without exchange in the 2D $T_1$-$T_2$ relaxogram with similar positions and patterns similar to those obtained from spinal cord white matter were used as the joint probability function F to generate the data following Equation 48 with Gaussian noise at various SNRs. Here the SNR was redefined as the ratio between $M(\tau_1=0, \tau_2=0)$ and the standard deviation of the noise. To obtain stable estimates, 1000 realizations were achieved for the full data and one random sampling was performed for each acceleration factor in each realization.

Furthermore, the potential artifacts caused by Rician noise were also simulated. An ROI consisting of 100 voxels with IR-ME sequence was synthesized. Within each voxel, the data $M_R$ was generated by changing the distribution of the signal in Equation 48 from Gaussian to Rician at SNR=200:

$$M_R(\tau_1, \tau_2) = \sqrt{\left[\sum_{m=1}^{N_m} \sum_{n=1}^{N_n} F(T_m, T_n)\exp(-\tau_1/T_m)\exp(-\tau_2/T_n) + \epsilon_1(\tau_1, \tau_2)\right]^2 + \epsilon_2(\tau_1, \tau_2)^2} \qquad (53)$$

The averaged data in the ROI was taken as the complete data set (SNR=2000) with 1000 repetitions. The following sub-sampling and data analysis was the same as described in Section 6.2.2 and the simulations with Gaussian noise.

6.3. Results 6.3.1 Simulations 6.3.1.1 Noise Type

Figure 12:
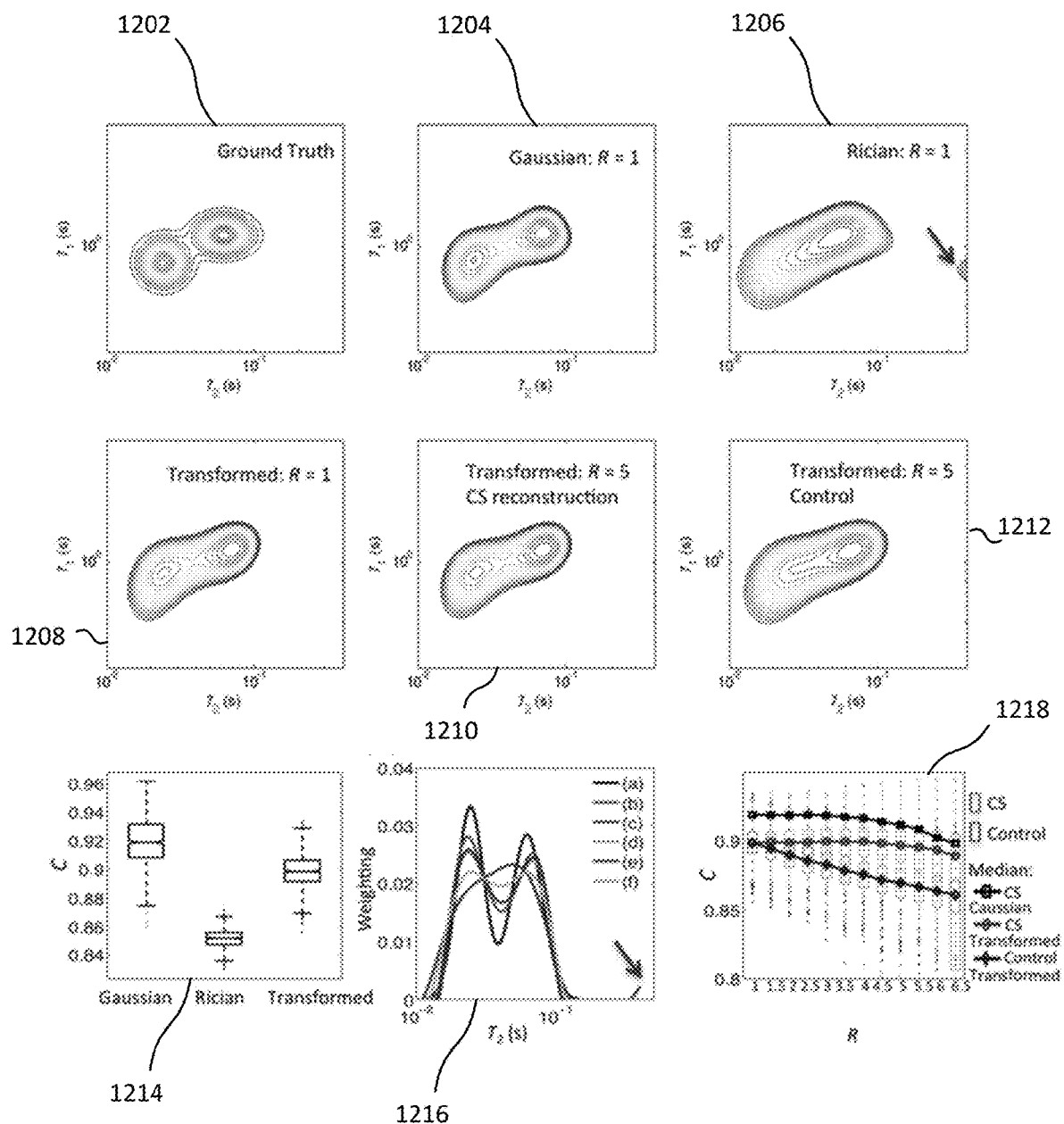
FIG. 12 shows $T_1$-$T_2$ relaxometry data produced from a simulation of an example approach with MR imaging.

FIG. 12 shows the $T_1$-$T_2$ relaxometry of (a) the simulated ground truth (plot 1202), (b) full data with Gaussian noise (plot 1204), (c) full data with magnitude signal and rectified Rician noise (plot 1206), (d) full data with transformed (Rician noise corrected) signal (plot 1108), (e) CS reconstruction from the transformed data at R=5 (plot 1210), and (f) the corresponding control (plot 1212). Plot 1214, (g), shows the statistical results of the correlation coefficients of (b-d). Plot 1116, (h), shows the normalized $T_2$ projections of (a-f). The statistical results of the correlation coefficients of the CS reconstruction from the data with Gaussian noise (black), the transformed signals from magnitude data (red) and its corresponding control (blue) at various acceleration factors R are illustrated in plot 1218 (i).

For the full data with Gaussian noise, the 2D ILT algorithm yields a close estimate (plot 1104) of the ground truth (plot 1202) with a correlation coefficient C=0.92 (plot 1214). Uncorrected Rician noise introduces spurious peaks in the long $T_2$ regime, which were visible in both the $T_1$-$T_2$ relaxometry (arrow in plot 1206) and its 1D projection onto the $T_2$ axis (arrow in plot 1216). In addition, the two peaks are merged indistinguishably into one in both the $T_1$ and $T_2$ dimensions. The application of the signal transformation correction successfully removes the spurious peaks and makes the ground-truth peaks distinguishable (plot 1208 and plot 1216) with the recovery of the correlation coefficient from 0.85 to 0.90 (plot 1214).

Sub-sampling was performed both on the data with Gaussian noise and on the data with the transformed data. The statistical results were shown in plot 1218, where only the median was plotted for the data with Gaussian noise for display. Within the transformed data, the CS reconstruction successfully achieves a high correlation coefficient C~0.90 with a small variance until R reaches 5, which is significantly higher than the results of the control ($p<1\times10^{-9}$). Except for the higher correlation coefficients, better contrast is also observed with CS reconstruction. For example, at R=5, the contrast between the two peaks is 69% with the CS reconstruction, but 89% in the control, where the ground truth is 34%.

6.3.1.2 Noise Amplitude

Figure 13:
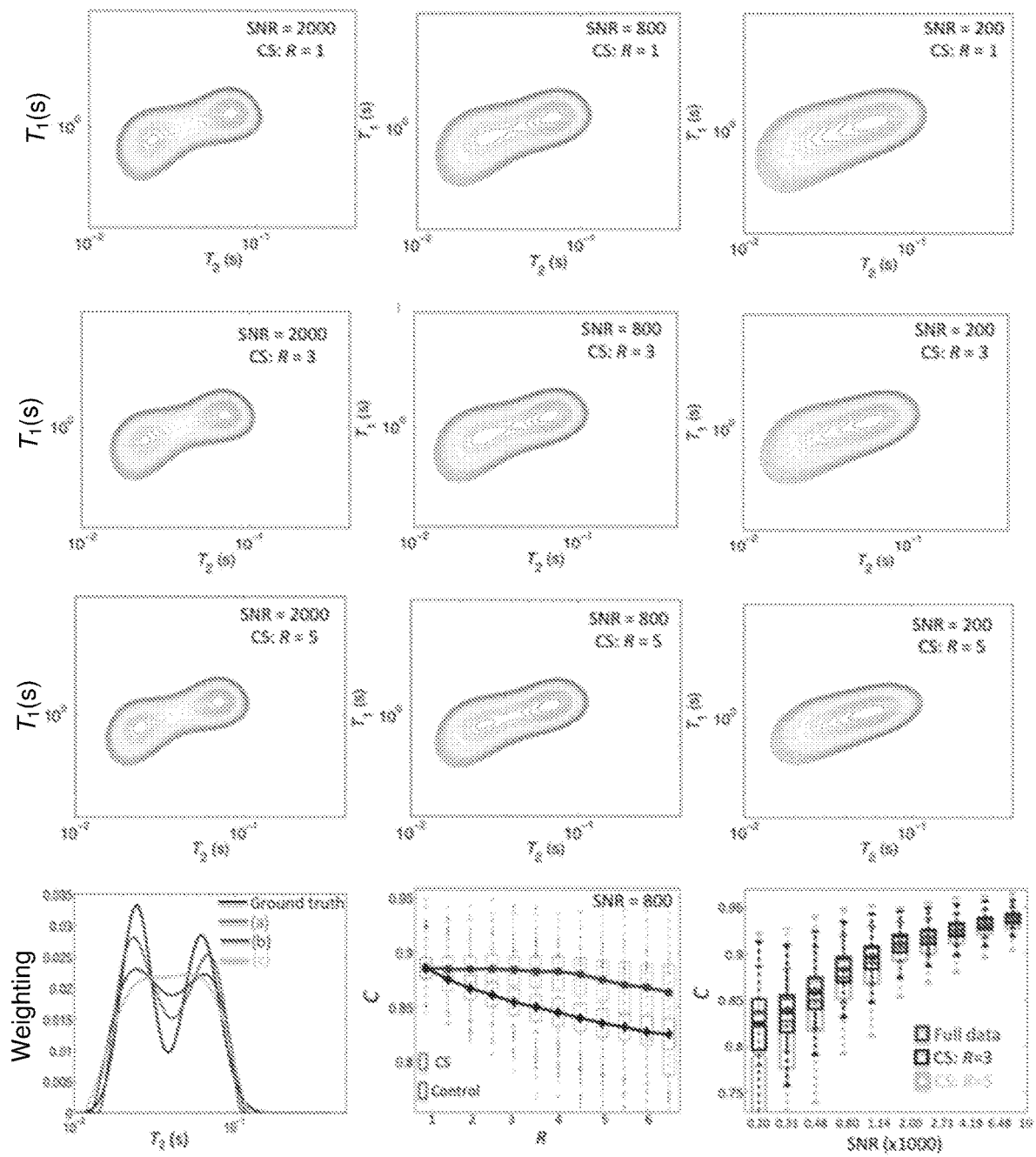
FIG. 13 shows $T_1$-$T_2$ relaxometry data produced from a simulation of an example approach with various signal-to-noise ratios.

FIG. 13 illustrates, in plots 1300, (a-i) $T_1$-$T_2$ relaxometry from the stimulated data with Gaussian noise at three SNR levels (SNR=2000, 800 and 200) and three acceleration factors: R=1, 3 and 5. (j) The normalized $T_2$ projections of (ac) and the ground truth. (k) The boxplots of the correlation coefficients of the CS reconstruction (red) and the control (blue) from the simulated data with Gaussian noise at SNR=800 at various acceleration factors, R, and the broader lines and dots are the median of the data at each R. (1) The boxplots of the correlation coefficients of the full data (red), CS reconstruction at R=3 (blue) and R=5 (green) at various SNR. For the display purpose, the outliers were not shown.

The quality of the $T_1$-$T_2$ spectra from the full data itself decreases as the SNR in the simulations with Gaussian noise decreases as shown in FIG. 13. For example, the correlation coefficients drop from 0.94 to 0.84 when the SNR decreases from 10000 to 200 (plot 1). Except for the decrease in the correlation coefficient, the contrast between the two peaks is also artificially reduced owing to the larger noise amplitude, which can be seen by comparing the $T_1$-$T_2$ spectrum with different noise amplitudes (plots a-c, FIG. 13). The contrast in the 1D $T_2$ projection is changed from 60% to 85% when the SNR drops from 2000 to 800, where the two peaks are indistinguishable at SNR=200.

The CS reconstruction from subsamples successfully maintains the quality of $\tau_1$-$T_2$ spectra at similar levels as the results from the full data when the SNR decreases. At R=3, the correlation coefficients from the subsample with CS reconstruction shows almost identical distributions as the results from the full data with slightly larger variance (1.5 times higher IQR) until the SNR drops below 800. At R=5, the correlation coefficients drops a little with larger variance, especially at lower SNR (<2000). Comparing to the control, the results from CS reconstruction shows much better quality at certain acceleration factors. For example, at SNR=800, the correlation coefficients from the CS reconstruction results are significantly higher than the control ($p<5\times10^{-9}$) until R≥5.5 (plot k, FIG. 13). At higher R, the sample size is not large enough to generate good-quality $T_1$-$T_2$ spectra via either the CS reconstruction or the conventional 2D ILT.

6.3.2 Urea/Water $T_1$-$T_2$ Spectra

Figure 14:
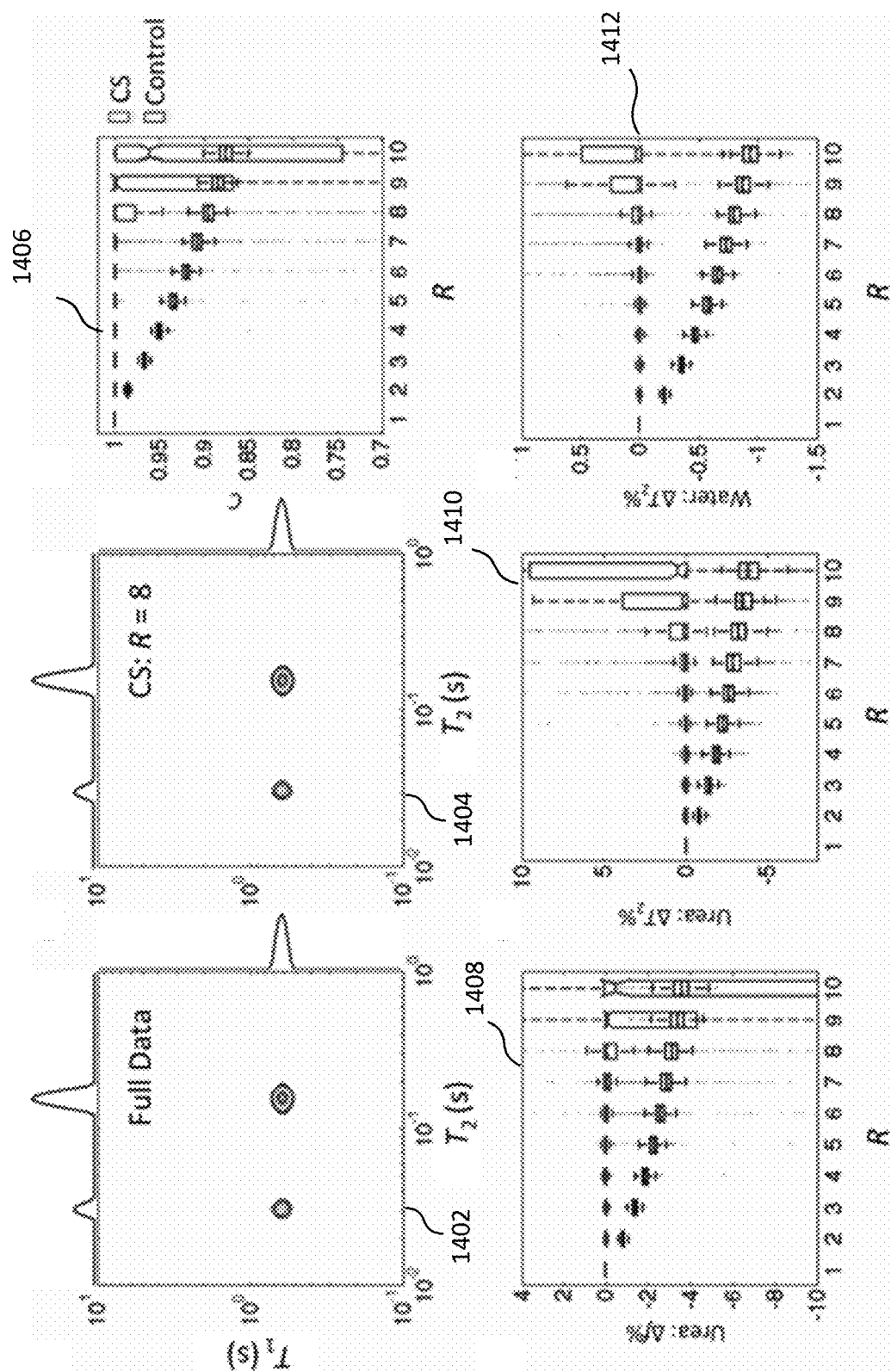
FIG. 14 shows experimentally derived $T_1$-$T_2$ spectra of a urea/water phantom from a full data set and example approaches using partial data.

Here only the fourth echoes of the 250 CPMG echo trains were used, which result in the matrix size of the full-data acquisition to be 50×62 with SNR≥5000. FIG. 14 illustrates the $T_1$-$T_2$ spectra of the urea/water phantom from (a) the full data (plot 1402) and (2) the CS reconstruction at R=8 (plot 1404), where the curves along the axes are the 1D projections on each dimension. Plots 1406, 1408, 1410, and 1412 (c-f) are the box plots of the statistical results from the 1000 realizations in each acceleration factor R, which includes (plot 1406) the correlation coefficients, the percentage of the biases of the urea's relative volume fraction (plot 1408), (e) $gmT_2$ (plot 1410) and (f) the water's $gmT_2$ (plot 1412).

The $T_1$-$T_2$ spectrum from the full data set is shown in plot 1402, where two peaks are clearly observed: urea with $gmT_2$=30.9 ms, $gmT_1$=618 ms and its relative volume fraction $f$=18.9% and the water with $gmT_2$=156 ms, $gmT_1$=614 ms and its relative volume fraction $f$=81.1%. The small bias of the relative volume fractions from 20%/80% is the result of exchange between the protons on the urea molecules and the ones on the water molecules. Along the axes shown in plots 1402 and 1404 are the projections of the $T_1$-$T_2$ distribution onto the $T_1$ and $T_2$ axes. A single peak is observed in the projected 1D $T_1$ spectrum with $gmT_1$=614 ms for both the full data and CS reconstruction at R=8. Two peaks are observed in the projected 1D $T_2$ spectra using the full data set with $f$=18.9% and $gmT_2$=30.9 ms for the urea, $f$=81.1% and $gmT_2$=156 ms for the water. The corresponding values at R=8 with CS reconstruction are $f$=18.6% and $gmT_2$=30.9 ms for the urea, $f$=81.4% and $gmT_2$=156 ms for the water.

In plot 1404, the $T_1$-$T_2$ spectrum with acceleration factor R=8 is presented, which has a very high correlation coefficient C>0.999. In contrast, the corresponding value of 1000 simulations in the control at R=8 drops to 0.895 as shown in plot 1406, which is significantly smaller than the CS reconstruction ($p<1\times10^{-9}$). With CS reconstruction at R≤8, the biases of the urea parameters are: 0.1% for the relative volume fraction, ≤0.1% for the $gmT_1$ and ≤1% for the $gmT_2$. The corresponding values for the water are: ≤0.02%, ≤0.01%. In contrast, the corresponding biases in the control at R=8 can be −3.1%, −0.2% and −3.2% for the urea and 0.73%, 0.09% and 0.80%. In addition, the variance of the results obtained with 1000 random samples is much smaller than the control at R≥6, and comparable to the control at R=7 and 8. At higher acceleration factors (R≥9), very large variance and growing bias are observed.

Figure 15:
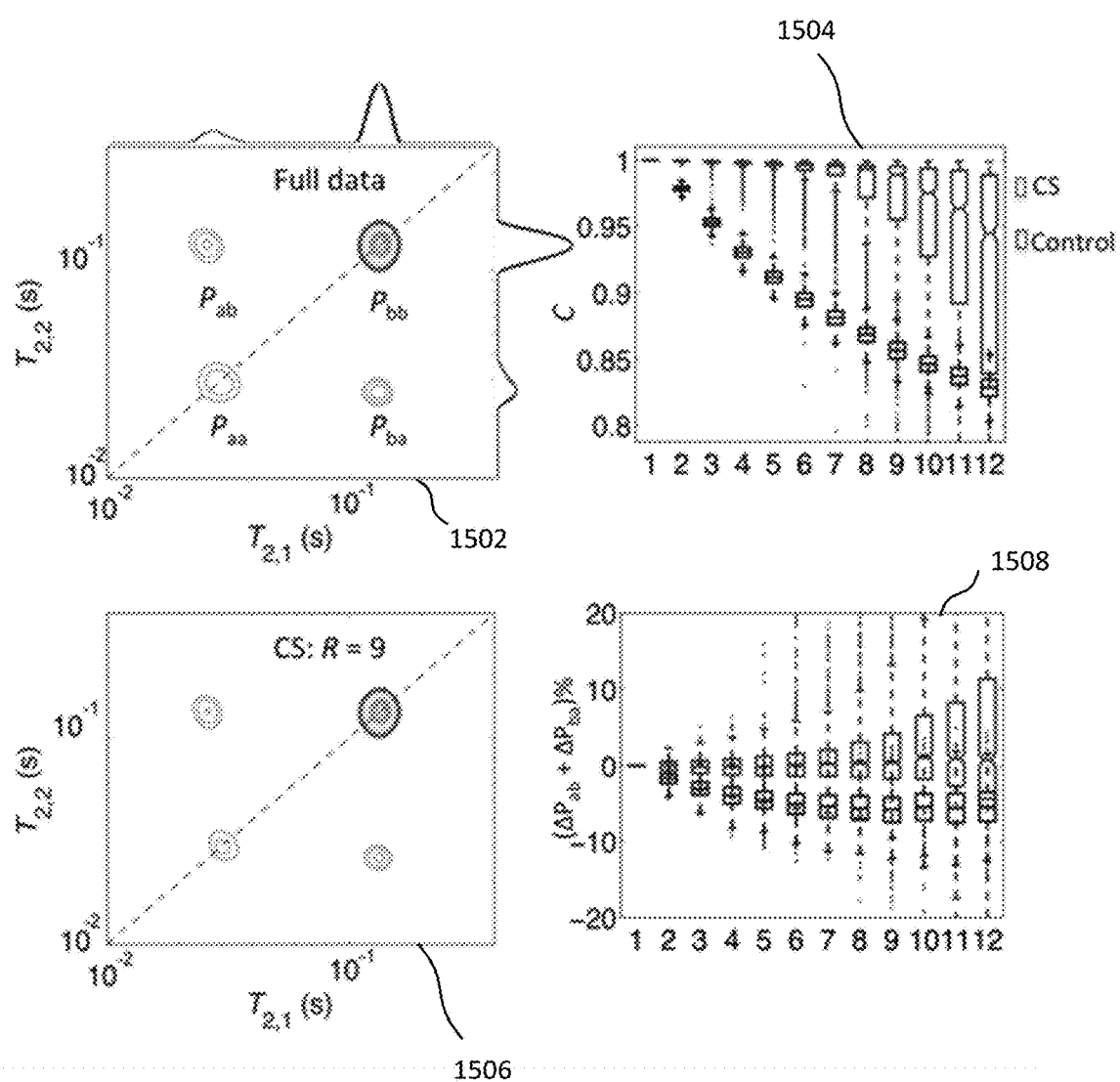
FIG. 15 shows experimentally derived $T_2$-$T_2$ spectra of a urea/water phantom from a full data set and example approaches using partial data with a mixing time of 1000 ms.
Figure 16:
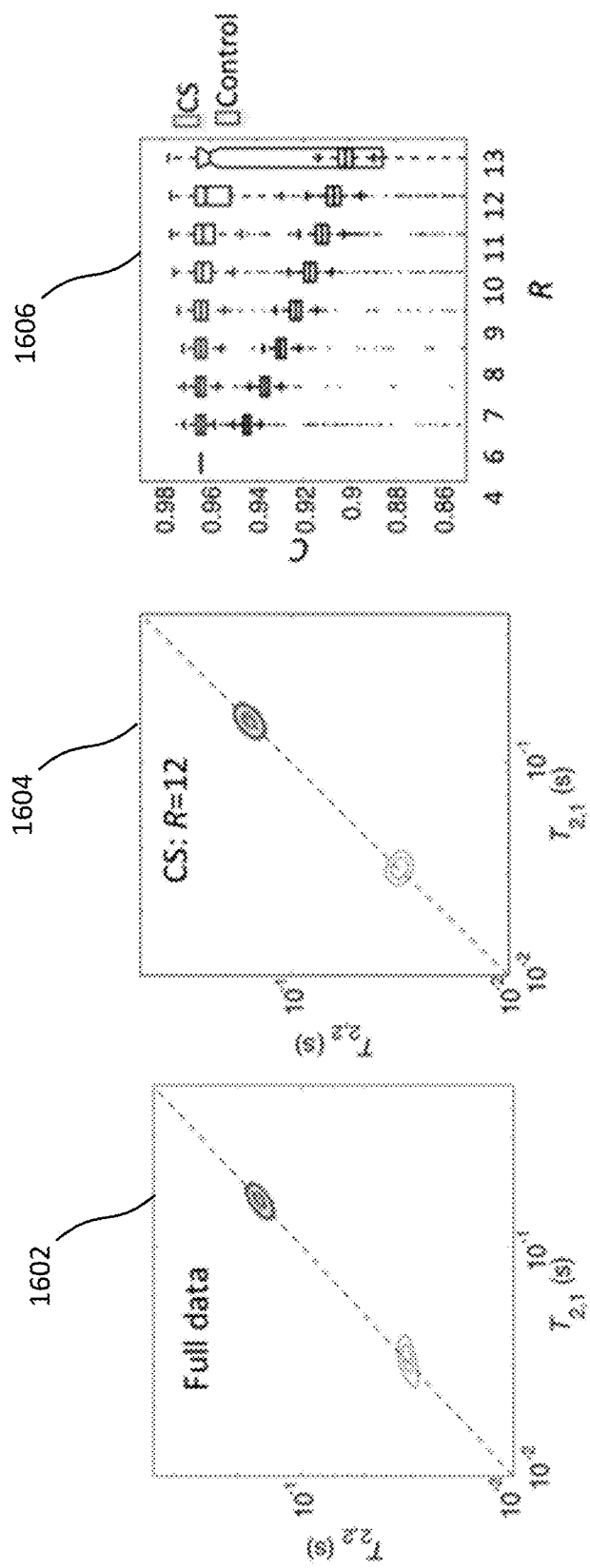
FIG. 16 shows experimentally derived $T_2$-$T_2$ spectra of a urea/water phantom from a full data set and example approaches using partial data with a mixing time of 50 ms.

6.3.3 Urea/Water $T_2$-$T_2$ Spectra $T_2$-$T_2$ spectra of the urea/water phantom at different mixing times are shown in FIG. 15 and FIG. 16. As the mixing time becomes longer, the total signal intensity goes down while the relative fraction of the off-diagonal peaks increases. A two-site exchange model was used to fit the amplitudes of the peaks with the estimate of the urea proton fraction being 19.6% and the exchange rate 0.35 $s^{-1}$. Two peaks at $\tau_m$=50 ms and $\tau_m$=1000 ms were chosen to test the performance of the CS reconstruction, which have a SNR~5000 and 1000. The statistical results of the CS reconstruction at $\tau_m$=50 ms and $\tau_m$=1000 ms are illustrated in FIGS. 15 and 16.

FIG. 15 illustrates $T_2$-$T_2$ spectra of the urea/water phantom at mixing time $\tau_m$=1000 ms from (a) the full data (plot 1502) and (c) the CS reconstruction at R=9 (plot 1506). 1504 and 1508 are the statistical results of (plot 1504) the correlation coefficients and (d), plot 1508, the biases of the off-diagonal peaks' relative volume fractions as a function of the acceleration factor R, where the red (top) is the CS reconstruction and the blue (bottom) is the corresponding control.

FIG. 16 illustrates $T_2$-$T_2$ spectra of the urea/water phantom at mixing time $\tau_m$=50 ms from (a) the full data (plot 1602) and (b) the CS reconstruction at R=12 (plot 1604). Plot 1606, (c), shows correlation coefficients as a function of the acceleration factor R, where the red (top) is the CS reconstruction and the blue (bottom) is the corresponding control.

At $\tau_m=1000$ ms, the off-diagonal peaks ($P_{ab}$ and $P_{ba}$) appear with the total relative volume fraction 15.1%, where the relative volume fractions of the unchanged urea ($P_{aa}$) and the water ($P_{bb}$) are 11.3% and 73.6%. At R≤9, the correlation coefficients between the CS reconstructed $T_2$-$T_2$ spectra and the one from full data can be maintained as high as ≥0.989, which are significantly higher than the control ($p<1\times10^{-9}$); this coefficient begins to fall quickly with larger variance at R≥10. In the control, there is a strong underestimation of the relative fraction of the off-diagonal peaks, $P_{ab}+P_{ba}$, and an overestimation of the water peaks $P_{bb}$, which can be as large as 14.5% and 1.8% at R=9. CS reconstruction successfully corrects the biases back (e.g., 1.1% (overestimation) and 0.36% (overestimation) at R=9), with almost the same variance at low R and a slightly larger variance at high R (e.g., 1.8 times higher in IQR than the control at R=9). Except for the precise reconstruction of the each peak's relative fraction, the other relaxation parameters are also more accurate. For example, the $gmT_2$ of the peak $P_{ab}$ is underestimated by 8.2% and 3.1% at the first and second dimension in the control case at R=9, while biases in the CS reconstruction are only 1.6% and 0.24% overestimation in these peaks.

At mixing time $\tau_m=50$ ms, good CS reconstruction can be obtained until R=12. Here the 125×125 data matrix was evenly sub-sampled into a 62×62 matrix (R=4) at first, and then the further sub-sampling was performed randomly on the 62×62 data matrix. In plot 1604 of FIG. 16, the statistical median of the 1000 $T_2$-$T_2$ spectra at R=12 was shown, which has a correlation coefficient C=0.962, very close to the corresponding value (0.964) at R=4. At R≤12, the statistical estimations of the other relaxation and amplitude parameters are also accurate and precise: such as the median biases of the relative volume fraction, $gmT_{2,1}$ and $gmT_{2,2}$ of the urea peak are only 0.87%, 0.74%, and 0.45% comparing to the corresponding results from the full data.

6.3.4 Porcine Spinal Cord ROI Analysis

Figure 17:
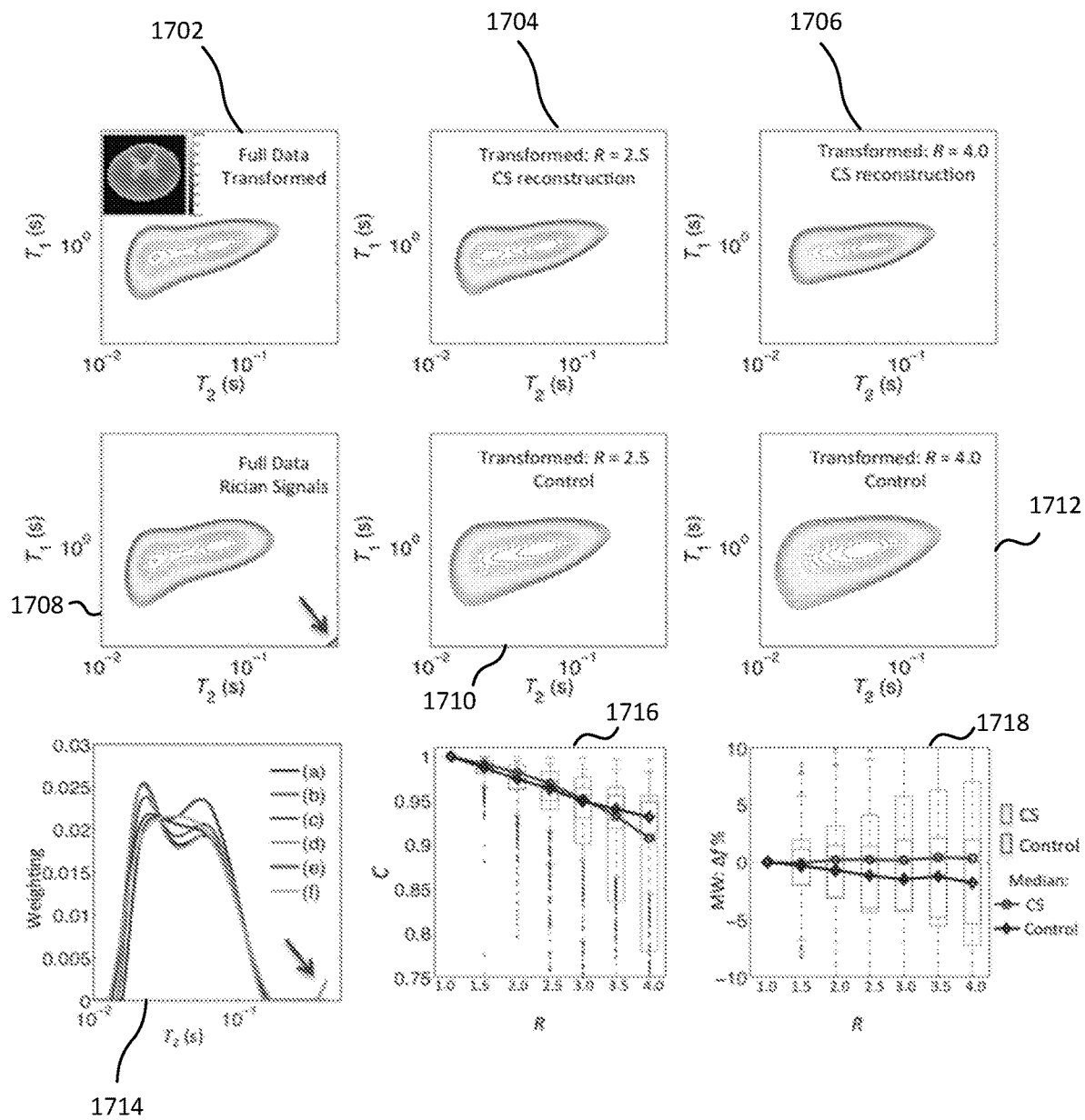
FIG. 17 shows the $T_1$-$T_2$ spectra reconstructed in a porcine spinal cord experiment.

The results of the ROI analysis on the dorsal white matter are shown in FIG. 17. FIG. 17 illustrates the $T_1$-$T_2$ spectra of (d) the original data at the dorsal white matter (plot 1708), (a) full data with transformed signal (plot 1702), (b) CS reconstruction from the transformed data at R=2.5 (plot 1704) and (c) at R=4.0 (plot 1706), (e) the control (plot 1710) corresponding to plot 1704 and (f) the control (plot 1712) corresponding to plot 1706. Plot 1714 shows the normalized 1D $T_2$ projections of plots 1702, 1704, 1706, 1708, 1710, and 1712. Plot 1716 shows the statistical results of (h) the correlation coefficients and plot 1718 shows (i) the MW fraction as a function of the acceleration factor R, where the red are the CS reconstruction and the blue are the corresponding controls.

The SNR in the white matter is around 200. Two broad peaks are observed in the $T_1$-$T_2$ spectra from the full data (pre-processed) with the myelin water (MW): $f=46.1\%$, $gmT_2=23.8$ ms and $gmT_1=837$ ms; and the intracellular/extracellular water (IEW): $f=53.9\%$, $gmT_2=62.3$ ms and $gmT_1=993$ ms. Here $\tau_2=35$ ms was taken as the separation line between MW and IEW.

Similar to the simulations, the noisy Rician signals introduce spurious peaks in the long $\tau_2$ regime (arrow in plot 1708 and plot 1714) but the signal transformation scheme we use successfully corrects this artifact. CS performs adequately at R=2.5, for which the correlation coefficient is 0.97 (significantly higher than the control, $p<1\times10^{-4}$) and the contrast between the two peaks is preserved (93% for the CS, 93% for the full data, and a single peak in the control). At R=4.0, the two peaks are still visible although the correlation coefficient (0.91) is lower than the control (0.93) now. Interestingly, the CS reconstruction does well at preserving the MW relative fraction (biases 0.41%), though with larger variance, for which the underestimation can be as large as 1.8% in the control at R=4.0. The "paired student's t-test" was performed on the results of MW relative fraction from both the CS reconstruction and the control with the null hypothesis that their means are equal to the result from full data. The hypothesis is accepted by the results from CS reconstruction (p≥0.15) expect for R=4.0 (p=0.02), while it is rejected by the results from the control ($p<1\times10^{-7}$).

6.4 Discussion

A pipeline designed to accelerate the acquisition of 2D relaxation spectra using compressed sensing, was tested and validated with respect to its efficiency in maintaining the quality of the 2D distributions with both simulations and real NMR and MRI experiments.

Compared to 1D relaxation spectra, clearly more information can be obtained from the 2D relaxation spectra, even in simple well-defined systems, like the urea/water mixture studied here. The 2D spectra can uncover and distinguish different relaxation components that may not be visible in the 1D spectra. For example, only one peak can be observed in the $T_1$ spectrum of the urea phantom, whereas two peaks are well defined in the $T_1$-$T_2$ relaxation spectra Furthermore, exchange information between different components can also be extracted from 2D relaxation spectra whereas this is not possible in the 1D case. In $T_2$-$T_2$ relaxometry of the urea phantom, the off-diagonal peaks provide direct evidence of exchange between the protons on the urea molecules and water molecules, whose rates of exchange can be then be quantitatively characterized by modeling and fitting the peaks' intensities. However, this is not obtained from 1D $T_2$ spectra alone.

The VSH approach discussed previously is very sensitive to the SNR and the type of noise. For example, in the simulations, either the change of noise type from Gaussian to Rician or the decreasing of SNR from 10000 to 200 will significantly affect the quality of the 2D relaxometry. Normally, a high SNR with Gaussian noise is required for good performance. This can be easily achieved for most NMR experiments with large sample sizes at high fields. As for MRI applications, typically the SNR is lower and the noisy amplitude signal should be transformed from a Rician distribution to a Gaussian distribution. To achieve higher SNR in MRI, ROI analysis can be applied in homogeneous regions.

In both simulations and the MRI experiments on the spinal cord, the presence of Rician noise introduces spurious peaks in the long $T_2$ regime because the rectification of the complex MR signal produces a "noise floor" which, uncorrected, is fit by the 2D-ILT routine in both dimensions. This baseline signal biases the signal decay, suggesting the presence of artifactually long $T_2$ components. This leads to the new peaks and decreases the contrast among existing ones, which is quite similar to the phenomenon observed previously in the $T_2$ spectra from noisy MRI magnitude data. A signal transformation framework for 1D $T_2$ spectra in multi-echo MRI is successfully applied here to the 2D relaxation spectra obtained from MRI data to remedy biases caused by Rician noise. While not perfect, these biases are significantly reduced.

CS reconstruction has been successfully applied to the simulated 2D relaxation spectrum data, experimental NMR data on a well-characterized urea/water phantom, and on the IR-ME MRI data from the porcine spinal cord. With the CS reconstruction, the size of the data matrix can be reduced significantly without compromising the quality of the final 2D relaxation spectrum. Comparing to controls, 2D relaxation spectra obtained from sub-samples using CS reconstruction shows a better approximation to the ground truth or to the results from full data, as demonstrated by the higher global correlation coefficient, better contrast among local peaks and more accurate volume fraction parameters. CS reconstruction can admit more outliers at higher R, where the noise in some specific sub-samples can cause the CS reconstruction to fail.

The maximum acceleration factor R can be achieved using CS reconstruction depends on the noise amplitude, noise type, the experimental design of the MR data acquisition protocol and the underlying ground truth. In the simulation, better $T_1$-$T_2$ spectra are obtained at high SNR (2000) compared to the low SNR (800) at the same acceleration factor. In the $T_2$-$T_2$ spectra of the urea/water phantom, R=12 can be achieved at a mixing time $\tau_m$=50 ms, but the maximum R at a mixing time $\tau_m$=1000 ms is 9, where the SNR is 5 times lower and the relaxometry spectra appear more complex. As for the simulations of the 2D relaxation spectra with MRI, the maximum R is around 5 even after the noise correction, since CS is performed using an already small data matrix.

Two distinguishable peaks were observed in the $T_1$-$T_2$ spectra of the white matter from the porcine spinal cord, which were assigned to be myelin water (shorter relaxation times) and intracellular/extracellular water (longer relaxation times). These results were consistent with previous 1D $T_2$ spectra measures in the white matter in vivo or ex vivo. Here the maximum R that can be achieved is equal to or less than 4.0, which is smaller than in the simulations. Several reasons may contribute to this reduction: (1) the SNR is lower in the experiments since the number of voxels in the ROI is less than 100; (2) the noise is still not Gaussian even after preprocessing since there might be some systematic artifacts; (3) heterogeneities may exist among voxels and ROI-type analysis might not be the best way; (4) the underlying ground truth of the $T_1$-$T_2$ relaxation spectra of the biological tissue is still poorly known, thus there might be biases in the $T_1$-$T_2$ relaxation spectra when the complete data set is used. Interestingly, even with a decreased correlation coefficient, CS reconstruction corrects the bias in estimating the MW and IEW fraction with the conventional 2D ILT method, though with larger variance.

The biggest obstacle to migrating 2D relaxation spectra measurement to in vivo preclinical and clinical MRI applications is the long acquisition time. For example, the total acquisition time for the IR-ME experiments in this experiment is 21 hours. In these experiments, the time can be reduced to 6 hours by an acceleration factor R=3.5. Further reduction in time can be made to enable in vivo applications. For example, the parameters chosen in the time-consuming IR pulse sequences applied here were conservative, leading to a long pre-scan delay. There are other pulse sequences with shorter acquisition time, such as the saturation-recovery prepared multi-echo (SR-ME) with echo-planer (EPI) acquisition pulse sequences whose total acquisition time is about 1 hour. If the same acceleration factor R=3.5 can be achieved there, the total acquisition time can now be reduced to 17 minutes. In addition, even a higher acceleration factor can be achieved as SNR increases with improvements in scanner hardware.

One practical concern of the CS reconstruction is the random sampling, which might be limited by the natural structure of the CPMG or multi-echo pulse trains, i.e., the reduction of the scan time is achievable in the first dimension of the three pulse sequences used here (shown in FIG. 10). However, in high-field MRI scanners, safety concerns, primarily power deposition in tissue owing to a high specific absorption rate (SAR) limits the total number of 180° pulses that can be applied per unit time. So a practical alternative would be using a single echo or a few echoes with a fast MRI acquisition, such as EPI, parallel imaging, multi-band excitation, etc. In these cases, acceleration provided by using a CS reconstruction could play an important role to reduce the acquisition time further and make 2D relaxation spectrum measurement faster.

Only 2D $T_1$-$T_2$ and $T_2$-$T_2$ MR relaxometry are validated here but this pipeline can be easily adapted to other 2D spectra, such as D-$T_2$, D-D, $T_1$-$T_1$, etc. provided that the application of the successive "filters" result in a relationship between the measured magnetization and the relaxation parameters that is given by a 2D Fredholm equation. Moreover, there is nothing to preclude performing higher dimensional (nD) relaxometry since compression efficiency can increase in CS with increased dimensionality particularly when data is sparse and compactly supported, as it appears to be the case with relaxation spectra. In addition, further data compression can be achieved if CS is used both in the Laplace space, as is done here, and in the Fourier space to reduce the number of MRI acquisitions required for spatial localization.

7 Examples of Computing Environments

Figure 18:
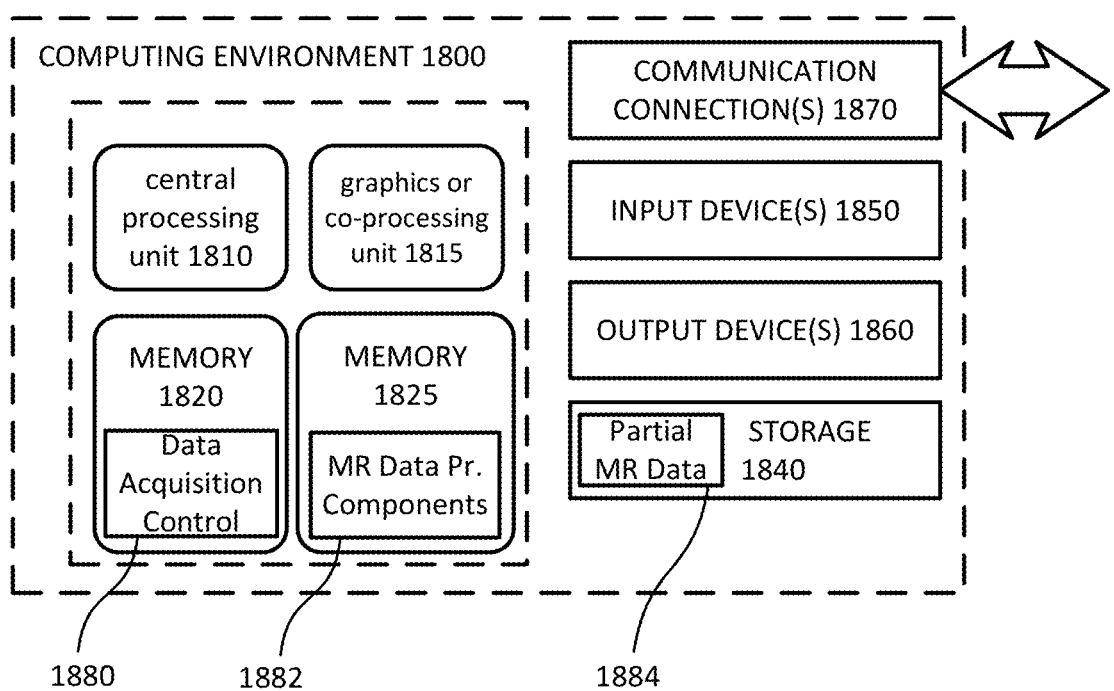
FIG. 18 is a diagram illustrating a generalized implementation environment in which some described examples can be implemented.

FIG. 18 depicts a generalized example of a suitable computing environment 1800 in which the described innovations may be implemented. The computing environment 1800 is not intended to suggest any limitation as to scope of use or functionality, as the innovations may be implemented in diverse general-purpose or special-purpose computing systems. For example, the computing environment 1800 can be any of a variety of computing devices (e.g., desktop computer, laptop computer, server computer, tablet computer, media player, gaming system, mobile device, etc.)

With reference to FIG. 18, the computing environment 1800 includes one or more processing units 1810, 1815 and memory 2020, 2025. In FIG. 18, this basic configuration 1830 is included within a dashed line. The processing units 1810, 1815 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 18 shows a central processing unit 1810 as well as a graphics processing unit or co-processing unit 1815. The tangible memory 1820, 1825 may be volatile memory (e.g., registers, cache, RAM), non-volatile memory (e.g., ROM, EEPROM, flash memory, etc.), or some combination of the two, accessible by the processing unit(s). The memory 1820, 1825 stores software implementing one or more innovations described herein, in the form of computer-executable instructions suitable for execution by the processing unit(s). For example, memory 1820 can store a data acquisition control 1880 that instructs an MR system to select a subset of voxels of a volume representing an object. MR data is acquired for the subset of voxels (partial MR data). Memory 1825 can store, for example, MR data processing components 1882, which can include data component 906, matrix determination component 908, reconstruction component 910, image generation engine 912, and data store 914 of FIG. 9.

A computing system may have additional features. For example, the computing environment 1800 includes storage 1840, one or more input devices 1850, one or more output devices 1860, and one or more communication connections 1870. An interconnection mechanism (not shown) such as a bus, controller, or network interconnects the components of the computing environment 1800. Typically, operating system software (not shown) provides an operating environment for other software executing in the computing environment 1800, and coordinates activities of the components of the computing environment 1800.

The tangible storage 1840 may be removable or non-removable, and includes magnetic disks, magnetic tapes or cassettes, CD-ROMs, DVDs, or any other medium which can be used to store information and which can be accessed within the computing environment 1800. Storage 1840 can store instructions for software implementing one or more innovations described herein. Storage 1840 can also store data such as partial MR data 2084.

The input device(s) 1850 may be a touch input device such as a keyboard, mouse, pen, or trackball, a voice input device, a scanning device, or another device that provides input to the computing environment 1800. For video encoding, the input device(s) 1850 may be a camera, video card, TV tuner card, or similar device that accepts video input in analog or digital form, or a CD-ROM or CD-RW that reads video samples into the computing environment 1800. The output device(s) 1860 may be a display, printer, speaker, CD-writer, or another device that provides output from the computing environment 1800.

The communication connection(s) 1870 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:
1. A magnetic resonance system, comprising:
 a controller configured to select a partial set of multidimensional magnetic resonance data to be acquired for at least one voxel of an object;

a magnetic resonance system coupled to the controller and operable to acquire the selected partial set of multidimensional magnetic resonance data; and wherein the controller is further configured to receive the acquired partial set of multidimensional magnetic resonance data from the magnetic resonance system and reconstruct a complete set of multidimensional magnetic resonance data for the at least one voxel of the object based on the acquired partial set of multidimensional magnetic resonance data.

2. The magnetic resonance system of claim 1, wherein the controller is operable to determine a compressed data matrix that represents the complete set of multidimensional magnetic resonance data for the at least one voxel of the object based on the acquired partial set of multidimensional magnetic resonance data.

3. The magnetic resonance system of claim 2, wherein the controller is operable to reconstruct data for the at least one voxel of the object by performing an inverse transform on the compressed data matrix.

4. The magnetic resonance system of claim 3, wherein the at least one voxel includes a plurality of voxels and the controller is operable to generate an image representing the object using the reconstructed data.

5. The magnetic resonance system of 4, wherein, the multidimensional magnetic resonance data includes data in at least two dimensions for the each of the plurality of voxels.

6. The magnetic resonance system of claim 4, wherein the voxels of the plurality of voxels have a uniform size, and the selected partial set of multidimensional magnetic resonance data comprises at least some measurements corresponding to each of the plurality of voxels.

7. The magnetic resonance system of claim 1, wherein the partial set of multidimensional magnetic resonance data to be acquired is selected by randomly sampling a multidimensional data space corresponding to the complete set of multidimensional magnetic resonance data representing the object.

8. The magnetic resonance system of claim 1, wherein the multidimensional magnetic resonance data is T1-T2 or T2-T2 relaxometry data.

9. The magnetic resonance system of claim 1, wherein the partial set of multidimensional magnetic resonance data to be acquired is selected as a fraction of a complete set of multidimensional magnetic resonance based on an acceleration factor.

10. The magnetic resonance system of claim 9, wherein the resonance factor is at least 5.

11. A computer-implemented magnetic resonance method, comprising:
    selecting a partial set of multidimensional magnetic resonance data representing at least one voxel of an object for acquisition by a magnetic resonance system, the selected partial set of multidimensional magnetic resonance data including magnetic resonance data in at least two dimensions for the at least one voxel;
    acquiring the selected partial set of multidimensional magnetic resonance data representing the at least one voxel; and
    reconstructing data for the at least one voxel based on the acquired selected partial set of multidimensional magnetic resonance data.

12. The computer-implemented magnetic resonance method of claim 11, further comprising:
    determining a compressed data matrix for the at least one voxel based on the acquired selected partial set of multidimensional magnetic resonance data, wherein the reconstructing data for the at least one voxel is based on the compressed data matrix.

13. The computer-implemented magnetic resonance method of claim 11, wherein the partial set of multidimensional magnetic resonance data representing at least one voxel of an object is selected based on an acceleration factor.

14. The computer-implemented magnetic resonance method of claim 13, wherein the acceleration factor is at least 5.

15. The computer-implemented magnetic resonance method of claim 14, wherein the at least one voxel comprises a plurality of voxels of a uniform size.

16. The computer-implemented magnetic resonance method of claim 15, wherein the selected partial set of multidimensional magnetic resonance data comprises at least some multidimensional data for each of the plurality of voxels.

17. The computer-implemented magnetic resonance method of claim 11, wherein the partial set of multidimensional magnetic resonance data is selected by randomly sampling a data space representing the complete set of multidimensional magnetic resonance data.

18. The computer-implemented magnetic resonance method of claim 11, wherein the multidimensional magnetic resonance data is two-dimensional diffusion/relaxation spectral data, and wherein reconstructing data for the object comprises performing a two-dimensional inverse Laplace transform on a compressed data matrix.

19. The computer-implemented magnetic resonance method of claim 18, wherein the two-dimensional spectra data comprises at least one of T1-T2, T2-T2, D-T2, D-D, D-T1, or T1-T1 data.

20. The computer-implemented magnetic resonance method of claim 12, wherein determining the compressed data matrix comprises minimizing both (i) a nuclear norm of a minimization matrix having a same rank as the compressed data matrix and (ii) a norm of a term relating the received partial set of magnetic resonance data to the minimization matrix.

21. The computer-implemented magnetic resonance method of claim 12, wherein the minimizing is accomplished through singular value thresholding.

* * * * *